United States Patent
Lesso et al.

(10) Patent No.: US 11,998,948 B2
(45) Date of Patent: Jun. 4, 2024

(54) DRIVER CIRCUITRY FOR PIEZOELECTRIC TRANSDUCERS

(71) Applicant: Cirrus Logic International Semiconductor Ltd., Edinburgh (GB)

(72) Inventors: John Paul Lesso, Edinburgh (GB); Toru Ido, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 968 days.

(21) Appl. No.: 16/921,369

(22) Filed: Jul. 6, 2020

(65) Prior Publication Data

US 2022/0001421 A1    Jan. 6, 2022

(51) Int. Cl.
*B06B 1/02*    (2006.01)

(52) U.S. Cl.
CPC ........ *B06B 1/0261* (2013.01); *B06B 2201/55* (2013.01)

(58) Field of Classification Search
None
See application file for complete search history.

(56) References Cited

U.S. PATENT DOCUMENTS

| | | | |
|---|---|---|---|
| 9,093,925 B2 * | 7/2015 | Feng | H10N 30/802 |
| 11,081,635 B1 * | 8/2021 | Delano | H02N 2/067 |
| 2004/0046484 A1 * | 3/2004 | Schiller | H10N 30/802 |
| | | | 310/317 |
| 2006/0113864 A1 * | 6/2006 | Finley | F16K 31/004 |
| | | | 310/317 |
| 2006/0244339 A1 * | 11/2006 | Mazz | H10N 30/802 |
| | | | 310/317 |
| 2009/0072662 A1 * | 3/2009 | Sadler | H10N 30/802 |
| | | | 345/173 |
| 2011/0290286 A1 * | 12/2011 | Ohata | B06B 1/0207 |
| | | | 134/184 |
| 2011/0305356 A1 * | 12/2011 | Kwan | H04R 3/04 |
| | | | 381/190 |
| 2019/0294247 A1 * | 9/2019 | Hu | B06B 1/0207 |
| 2020/0403546 A1 * | 12/2020 | Janko | G08B 6/00 |
| 2021/0091296 A1 * | 3/2021 | Pu | H02N 2/0075 |
| 2021/0283738 A1 * | 9/2021 | Lu | G01R 19/0046 |
| 2022/0040731 A1 * | 2/2022 | Lesso | B06B 1/0207 |
| 2022/0161295 A1 * | 5/2022 | Lesso | H03K 17/063 |

(Continued)

FOREIGN PATENT DOCUMENTS

| | | | | |
|---|---|---|---|---|
| CA | 3090345 A1 * | 8/2019 | | H02J 50/001 |
| DE | 19827052 A1 | 12/1999 | | |
| FR | 3033956 A1 * | 9/2016 | | G01D 4/002 |

(Continued)

OTHER PUBLICATIONS

Partial International Search Report and Provisional Opinion of the International Searching Authority, International Application No. PCT/GB2021/051366, mailed Sep. 10, 2021.

*Primary Examiner* — Fekadeselassie Girma
(74) *Attorney, Agent, or Firm* — Jackson Walker L.L.P.

(57) ABSTRACT

The present disclosure relates to driver circuitry for driving a piezoelectric transducer. The circuitry comprises: a power supply; a reservoir capacitance; switch network circuitry; and control circuitry. The control circuitry is configured to control operation of the switch network circuitry so as to charge the reservoir capacitance from the power supply and to transfer charge between the reservoir capacitance and the piezoelectric transducer.

22 Claims, 19 Drawing Sheets

(56) References Cited

U.S. PATENT DOCUMENTS

2022/0254980 A1\* 8/2022 Lesso ................. G01S 7/527

FOREIGN PATENT DOCUMENTS

| GB | 2484198 A | \* | 4/2012 | ............ | H02M 3/158 |
| JP | 2004515091 A | \* | 5/2004 | ........... | H03F 3/2173 |
| JP | 2011135444 A | \* | 7/2011 | | |
| JP | 2013009179 A1 | | 1/2013 | | |

\* cited by examiner

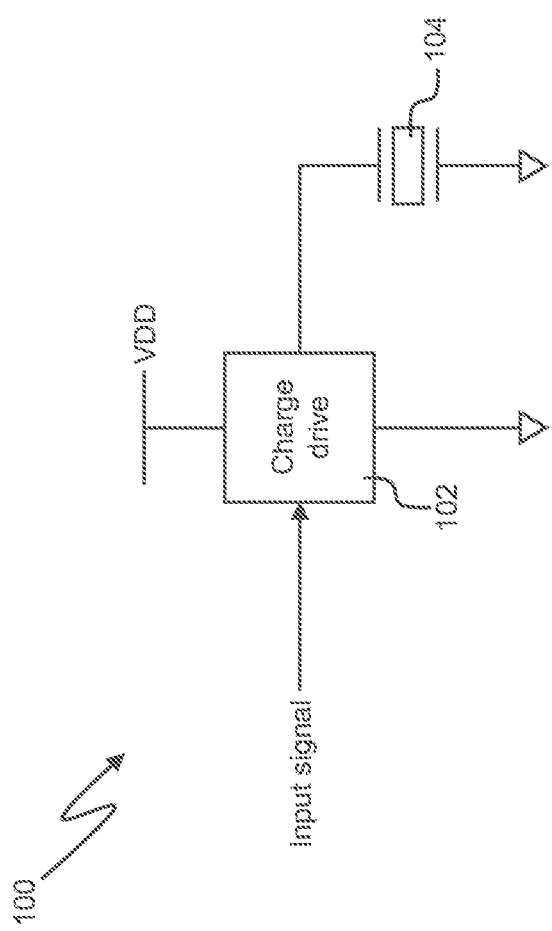

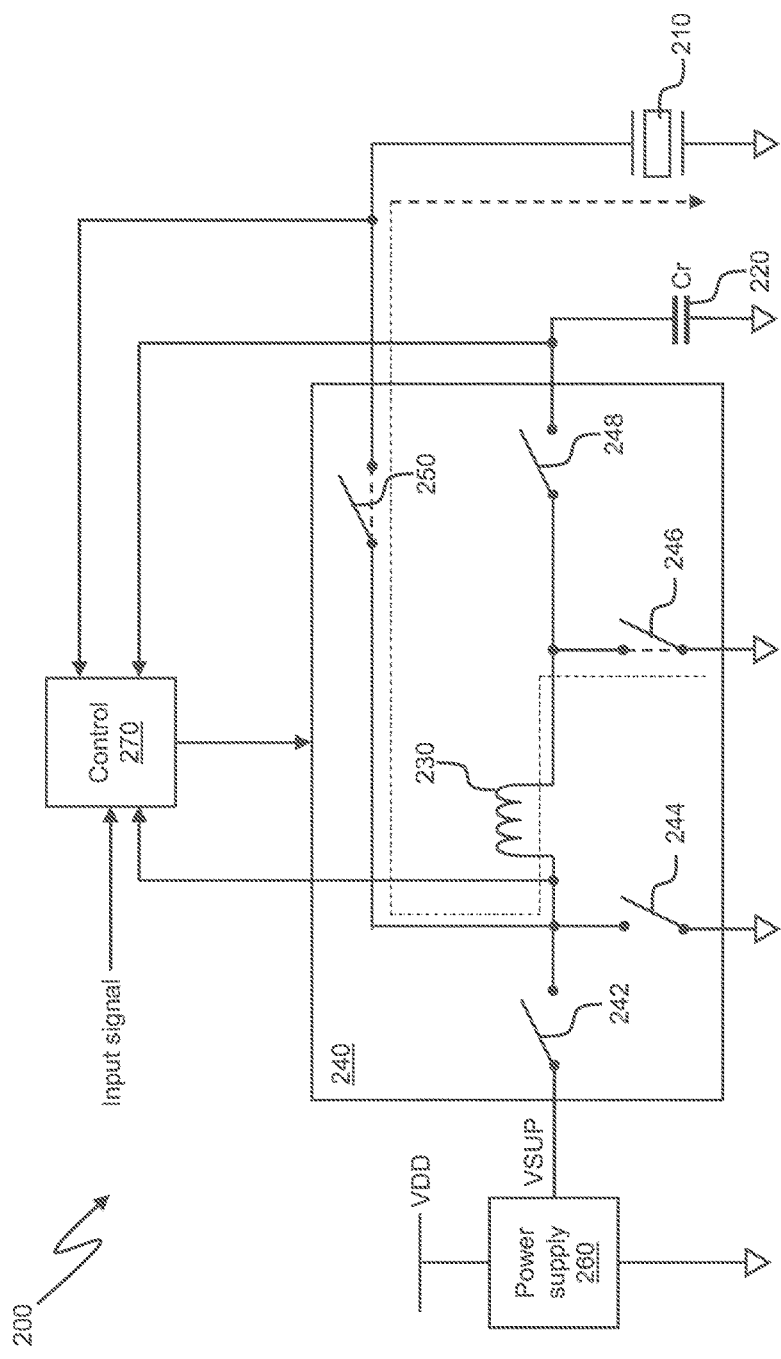

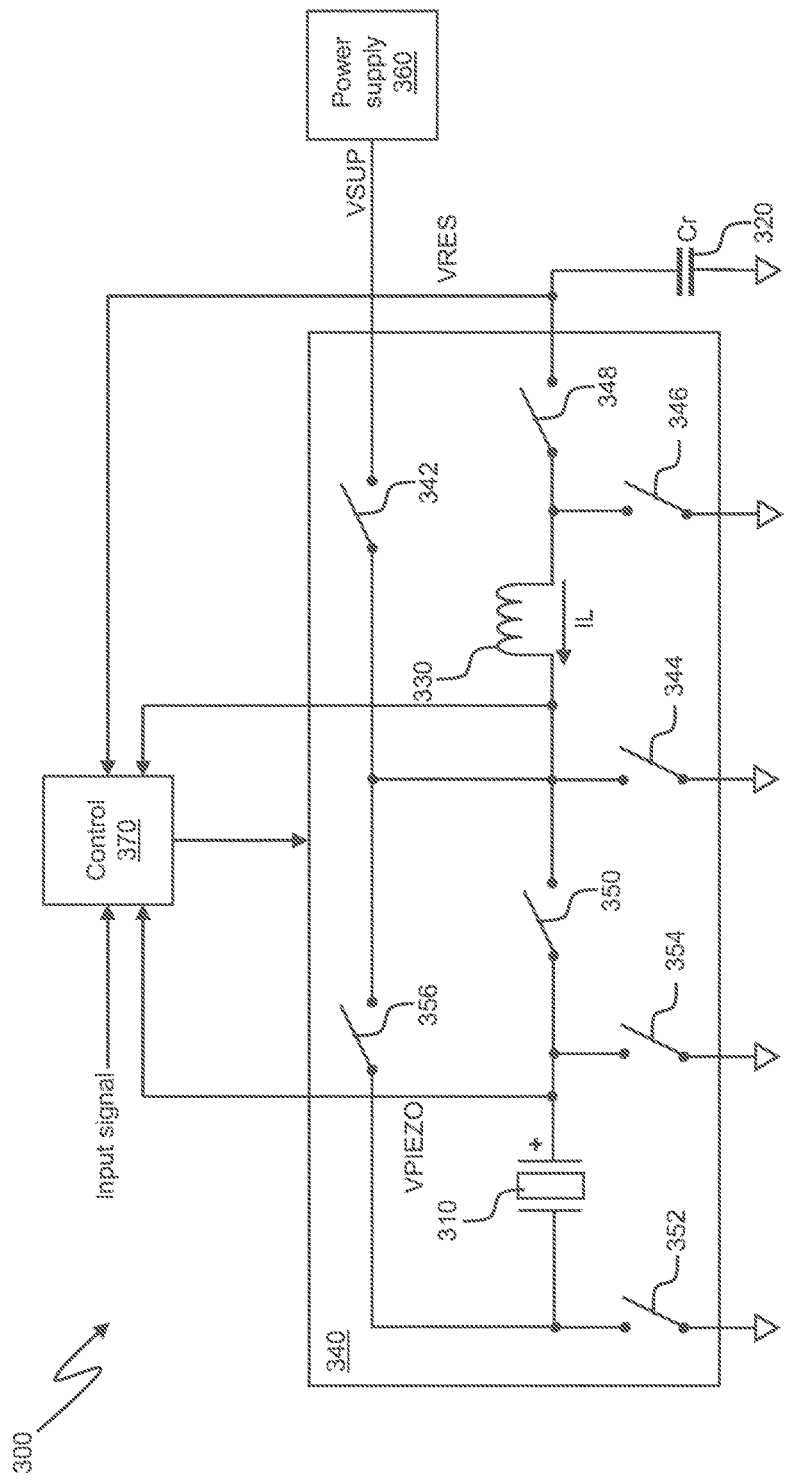

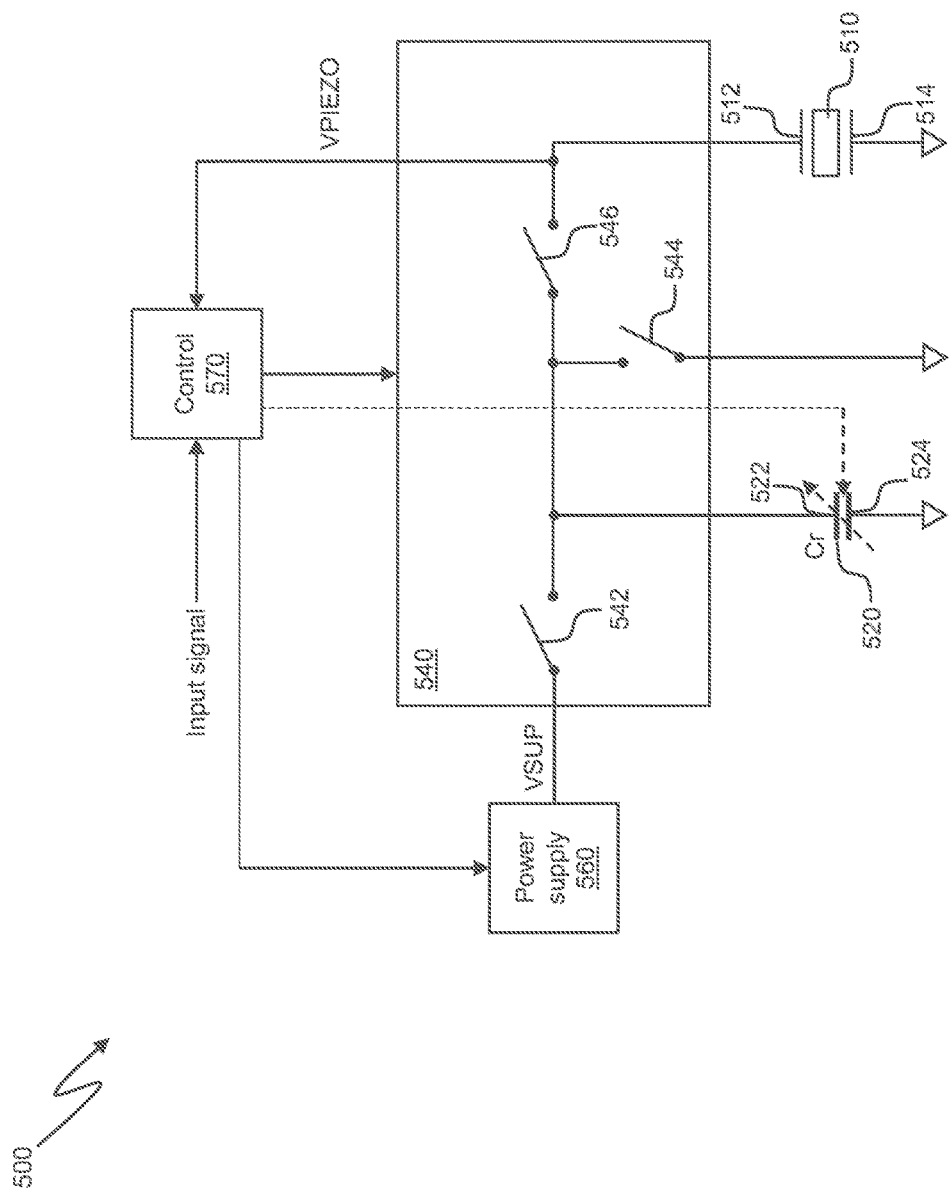

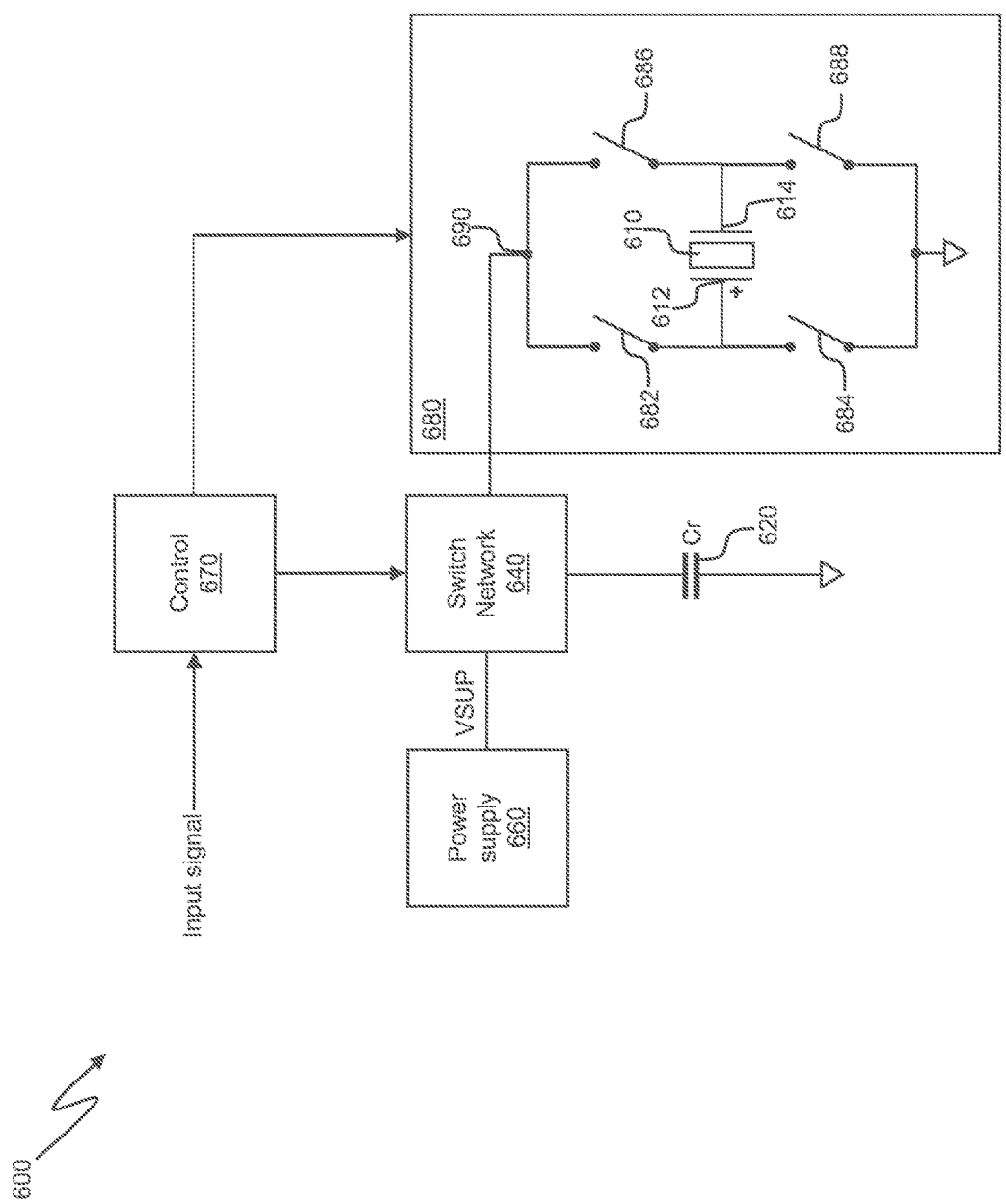

DRIVER CIRCUITRY FOR PIEZOELECTRIC TRANSDUCERS

FIELD OF THE INVENTION

The present disclosure relates to driver circuitry for piezoelectric transducers.

BACKGROUND

Piezoelectric transducers are increasingly being seen as a viable alternative to transducers such as speakers and resonant actuators for providing audio and/or haptic outputs in devices such as mobile telephones, laptop and tablet computers and the like, due to their thin form factor, which may be beneficial in meeting the demand for increasing functionality in such devices without significantly increasing their size. Piezoelectric transducers are also increasingly finding application as transducers for ultrasonic sensing and range-finding systems.

Piezoelectric transducers can be voltage-driven. However, when driven by voltage piezoelectric transducers exhibit both hysteresis and creep, which means that when driven by voltage the displacement of a piezoelectric transducer depends on both the currently-applied voltage and on a previously-applied voltage. Thus, for any given driving voltage there are multiple possible displacements of the piezoelectric transducer. For audio applications this manifests as distortion.

One way of reducing hysteresis and creep and the associated problems in a piezoelectric transducers is to drive the transducer with charge instead of voltage. When driven with charge, the displacement of the piezoelectric transducer varies with the charge applied.

FIG. 1 is a schematic illustration of circuitry for driving a piezoelectric transducer with charge. As shown generally at 100 in FIG. 1, charge drive circuitry 102, which may be charge pump circuitry, for example, may receive an electrical input signal (e.g. an input audio or ultrasonic signal or haptic waveform) from upstream circuitry (not shown) such as amplifier circuitry, and drive a piezoelectric transducer 104 to cause the piezoelectric transducer 104 to produce an audible, ultrasonic or haptic output based on the electrical input signal.

It is desirable to transfer charge to the piezoelectric transducer with high efficiency, to minimise power consumption, particularly where the piezoelectric transducer and the drive circuitry 102 are part of a battery powered device such as a mobile telephone or the like. When transferring charge to the piezoelectric transducer 104, charge can be drawn from the power supply (e.g. a battery). However, when reducing charge on the piezoelectric transducer 104, transferring charge back to the power supply is not desirable, particularly where the power supply is a battery, as this can shorten the usable life of the battery.

Additionally, for thin piezoelectric transducers which include only a small number (e.g. 1) of layers of piezoelectric material, a relatively large voltage (e.g. 70 volts) is required to drive the piezoelectric transducer 104 to cause displacement of the transducer. If the drive circuitry 102 is powered by a low voltage power supply (e.g. a 3 volt battery), then a mechanism to increase the voltage available at the output of the drive circuitry 102 is required. Typically a switching converter would be used to boost the voltage. The duty cycle D of a switching converter for a given voltage gain g is given by me equation $$D = \frac{g}{1+g}.$$

Thus, for a voltage gain of 23.3 required to boost a 3 v supply voltage to a 70 v output voltage, a duty cycle of 96% would be required, if a single converter were used. As will be appreciated by those of ordinary skill in the art, this is difficult to achieve in practice. Using two or more converters to boost the supply voltage in multiple stages would reduce the duty cycle required at each converter, but would require multiple inductors (one for each converter) and many switches.

SUMMARY

According to a first aspect, the invention provides circuitry for driving a piezoelectric transducer based on an input signal, the circuitry comprising:
  a power supply;
  a reservoir capacitance;
  switch network circuitry; and
  control circuitry configured to control operation of the switch network circuitry so as to charge the reservoir capacitance from the power supply and to transfer charge between the reservoir capacitance and the piezoelectric transducer.

The circuitry may further comprise one or more inductors. The control circuitry may be configured to control operation of the switch network circuitry to transfer charge between the reservoir capacitance and the piezoelectric transducer via one of the one or more inductors.

The control circuitry may be configured to control operation of the switch network circuitry to transfer charge from the power supply to the reservoir capacitance via one of the one or more inductors.

Alternatively, the control circuitry may be configured to control operation of the switch network circuitry so as to transfer charge directly between the reservoir capacitance and the piezoelectric transducer.

A capacitance value of the reservoir capacitance may be variable.

The control circuitry may be further configured to control operation of the switch network to transfer charge from the power supply to the reservoir capacitance based on an indication of a level of the input signal.

The circuitry may further comprises monitoring circuitry configured to monitor a level or magnitude of the input signal and to output a signal indicative of the level or magnitude of the input signal to the control circuitry.

The circuitry may further comprise look-ahead circuitry configured to receive the input signal and to output a signal indicative of the level of the input signal to the control circuitry.

The circuitry accordingly may further comprise envelope detector circuitry configured to receive the input signal and to output a signal indicative of an envelope of the input signal to the control circuitry.

The switch network circuitry may be configured for coupling to a single terminal of the piezoelectric transducer.

Alternatively, the switch network circuitry may be configured to be coupled to first and second terminals of the piezoelectric transducer.

The power supply may be configured to provide an output voltage that varies according to a level of the input signal.

The power supply may be configured to provide an output voltage that is greater than a voltage supplied to the power supply by a power source.

The power supply may comprise a switching power supply, for example.

The control circuitry may be configured to receive a feedback signal indicative of a level of charge of the piezoelectric transducer.

The feedback signal may be based on a voltage across the piezoelectric transducer.

The circuitry may comprises one or more inductors, and the control circuitry may be configured to control operation of the switch network circuitry to transfer charge between the reservoir capacitance and the piezoelectric transducer via one of the one or more inductors, and the feedback signal may be based on a current through the one of the one or more inductors.

The input signal may comprise an audio signal, a haptic waveform or an ultrasonic signal.

The circuitry may further comprise commutator circuitry coupled to the switch network circuitry, the commutator circuitry being configured to selectively couple a first or a second terminal of the piezoelectric transducer to an output of the switch network circuitry.

According to a second aspect, the invention provides circuitry for driving a piezoelectric transducer based on an input signal, the circuitry comprising:
  a power supply;
  a reservoir capacitance;
  switch network circuitry; and
  control circuitry configured to control operation of the switch network circuitry so as to charge the reservoir capacitance from the power supply based on an indication of the input signal.

According to a third aspect, the invention provides circuitry for estimating a level of charge on a piezoelectric transducer, the circuitry comprising:
  an inductor for transferring charge to the piezoelectric transducer from a charge source;
  control circuitry configured to control transfer of charge to the piezoelectric transducer based on an input signal,
  wherein the control circuitry is configured to receive an indication of a current through the inductor and an indication of a voltage across the piezoelectric transducer,
  and wherein the control circuitry is configured to estimate the level of charge on the piezoelectric transducer based on:
    the indication of the voltage across the piezoelectric transducer when a frequency of the input signal is within a first range, and
    the indication of the current through the inductor when the frequency of the input signal is within a second range.

According to a fourth aspect, the invention provides integrated circuitry comprising the circuitry of any of the first to third aspects.

According to a fifth aspect, the invention provides a device comprising the circuitry of any of the first to third aspects.

The device may comprise, for example, a mobile telephone, a tablet or laptop computer, a smart speaker, an accessory device, headphones, earphones or earbuds.

BRIEF DESCRIPTION OF THE DRAWINGS

Embodiments of the invention will now be described, strictly by way of example only, with reference to the accompanying drawings, of which:

FIG. 1 is a schematic diagram illustrating the concept of driving a piezoelectric transducer with charge;

FIGS. 2b-2g illustrate the operation of the circuitry of FIG. 2a;

FIG. 3a is a schematic diagram illustrating alternative circuitry for transferring charge between a power supply, a reservoir capacitance and a piezoelectric transducer;

FIGS. 3b-3h illustrate the operation of the circuitry of FIG. 3a;

FIG. 5 is a schematic diagram illustrating circuitry for transferring charge between a power supply, a reservoir capacitance and a piezoelectric transducer; and FIG. 6 is a schematic diagram illustrating commutator circuitry that can be used to provide bipolar drive of a piezoelectric transducer.

DETAILED DESCRIPTION

Figure 2A:
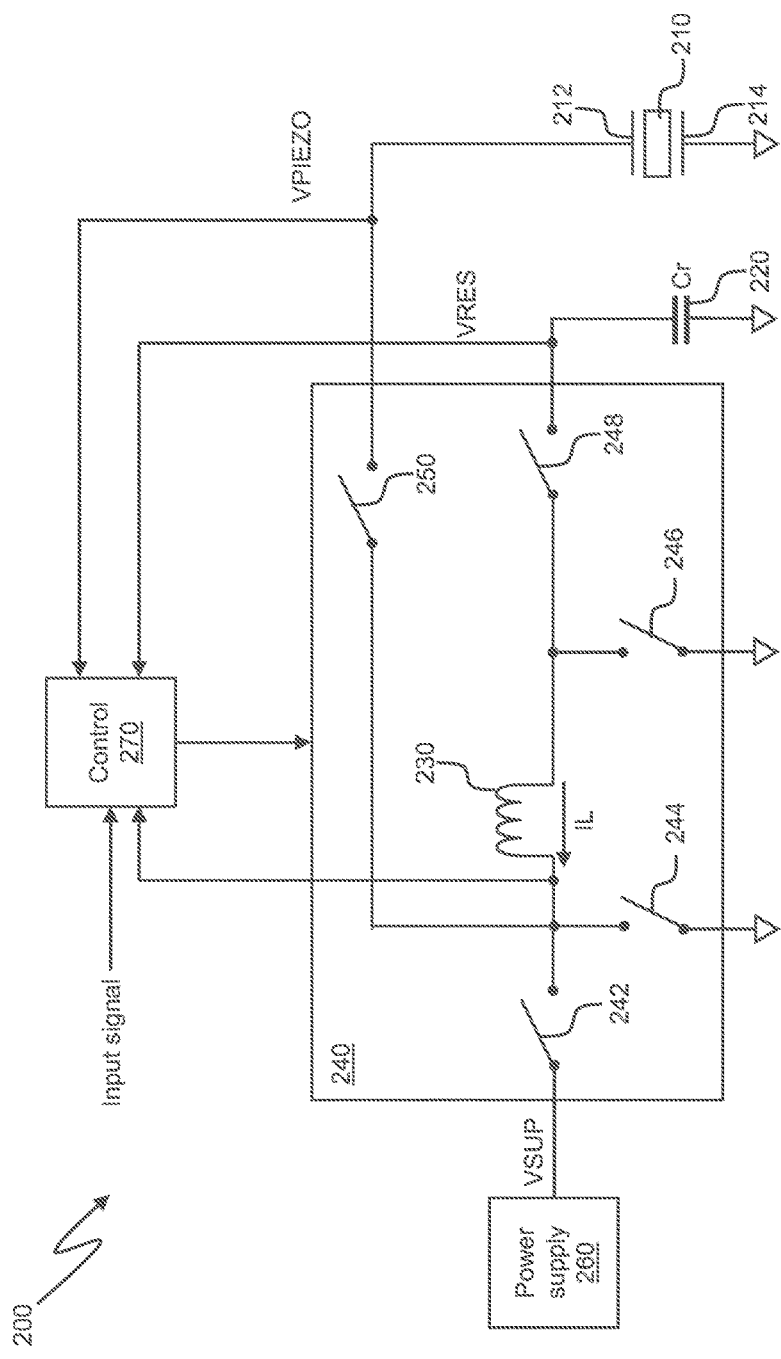
FIG. 2a is a schematic diagram illustrating circuitry for transferring charge between a power supply, a reservoir capacitance and a piezoelectric transducer.
Figure 2B:
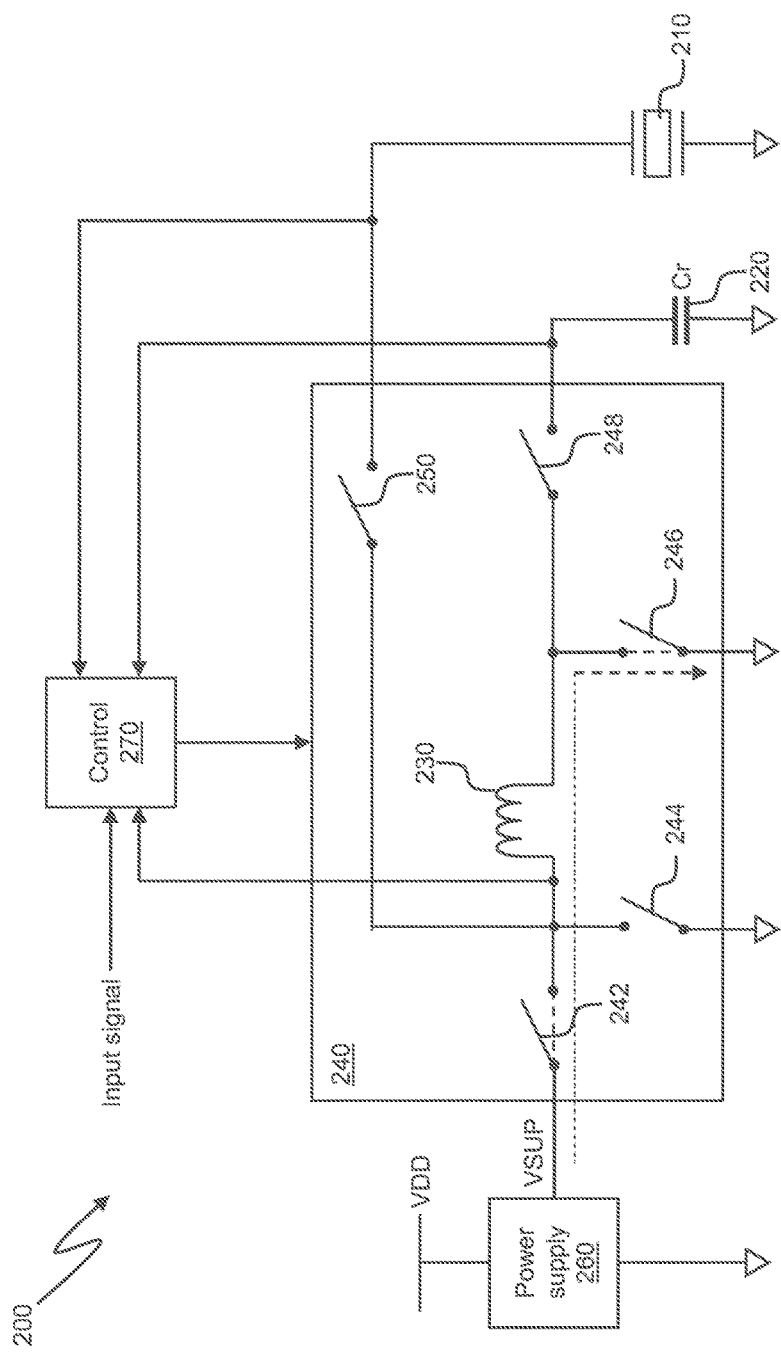

FIG. 2a is a schematic representation of a system 200 for driving a piezoelectric transducer 210.

The system 200 includes a reservoir capacitance 220 for storing charge, an inductor 230 and a switch network 240 (in this example comprising first to fifth controllable switches 242-250, which may be, for example, MOSFET devices) for transferring charge between the reservoir capacitance 220 and the piezoelectric transducer 210. The reservoir capacitance 220 is shown in FIG. 2a as a single capacitor, but it will be appreciated that the reservoir capacitance 220 may alternatively be provided by a plurality of capacitors coupled together.

The system 200 also includes a power supply 260 for selectively providing charge to the reservoir capacitance 220. In some examples the power supply 260 may comprise a battery. In other examples the power supply 260 may comprise power supply circuitry that receives power from a power supply such as a battery.

Although the system 200 is shown as including only a single inductor 230 (and this may be preferable, to minimise the number of external components and thus reduce the cost and space requirements of the system 200), in some examples there may be more than one inductor. For example, a first inductor may be provided for transferring charge from the power supply circuitry 260 to the reservoir capacitance 200 and a second inductor may be provided for transferring charge from the reservoir capacitance 220 to the piezoelectric transducer 210.

The first switching device 242 is coupled between an output of the power supply 260 and a first terminal the inductor 230.

The second switching device 244 is coupled between the first terminal of the inductor 230 and a ground/reference voltage supply rail.

The third switching device 246 is coupled between a second terminal of the inductor 230 and the ground/reference voltage supply rail.

The fourth switching device 248 is coupled between the second terminal of the inductor 230 and a first terminal of the reservoir capacitance 220. A second terminal of the reservoir capacitance is coupled to the ground/reference voltage supply rail.

The fifth switching device 250 is coupled between the first terminal of the inductor 230 and a first terminal 212 of the piezoelectric transducer 210. A second terminal 214 of the piezoelectric transducer 210 is coupled to the ground/reference voltage supply rail.

The system 200 further includes control circuitry 270, operable to control the switching devices 242-250 to control the transfer of charge between the power supply 260, the reservoir capacitance 220 and the piezoelectric transducer 210, as will now be explained with reference to FIGS. 2*b*-2*g*.

On start-up of the system 200 (or a host device incorporating the system 200), charge is transferred from the power supply 260 to the reservoir capacitance 220 to raise a voltage across the reservoir capacitance 220 to a level that is suitable for driving the piezoelectric transducer 210.

In a first phase of a charging process (illustrated in FIG. 2*b*), the first and third switches 242, 246 are closed, as indicated by the dashed lines, in response to appropriate control signals transmitted by the control circuitry 270. This creates a current path (indicated by the dashed arrow) through the inductor 230. As current flows through the inductor 230 a magnetic field develops around it, storing energy.

Figure 2C:
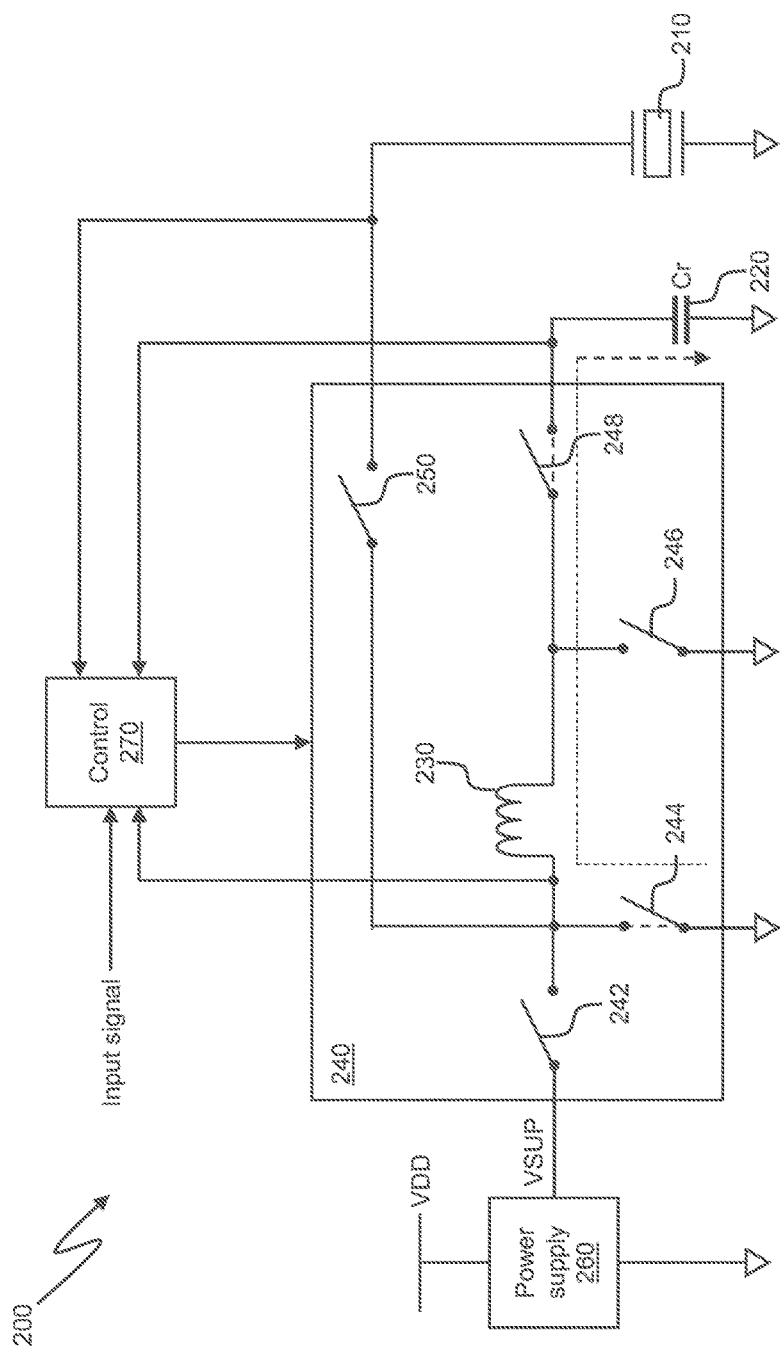

In a second phase of the charging process (illustrated in FIG. 2*c*), the first and third switches 242, 246 are opened and the second and fourth switches 244, 248 are closed, as indicated by the dashed lines in FIG. 2*c*, again in response to appropriate control signals transmitted by the control circuitry 270. The magnetic field around the inductor 230 collapses, inducing a current which flows from the inductor 230 to the reservoir capacitance 220, thereby charging the reservoir capacitance 220.

The first and second phases are repeated until the voltage across the reservoir capacitance 220 has increased to a level that is suitable for driving the piezoelectric transducer 210, as determined by the control circuitry 270 based on a feedback signal received from the piezoelectric transducer 210. Once the reservoir capacitance 220 has been charged up to the desired level the first switch 242 is opened, thus decoupling the power supply 260, such that the piezoelectric transducer 210 can be driven by transferring charge from the reservoir capacitance 220.

When the system 200 is required to increase the level of charge on the piezoelectric transducer 210, e.g. to drive the piezoelectric transducer 210 to produce a transducer output, the system 200 again operates in two phases.

Figure 2D:
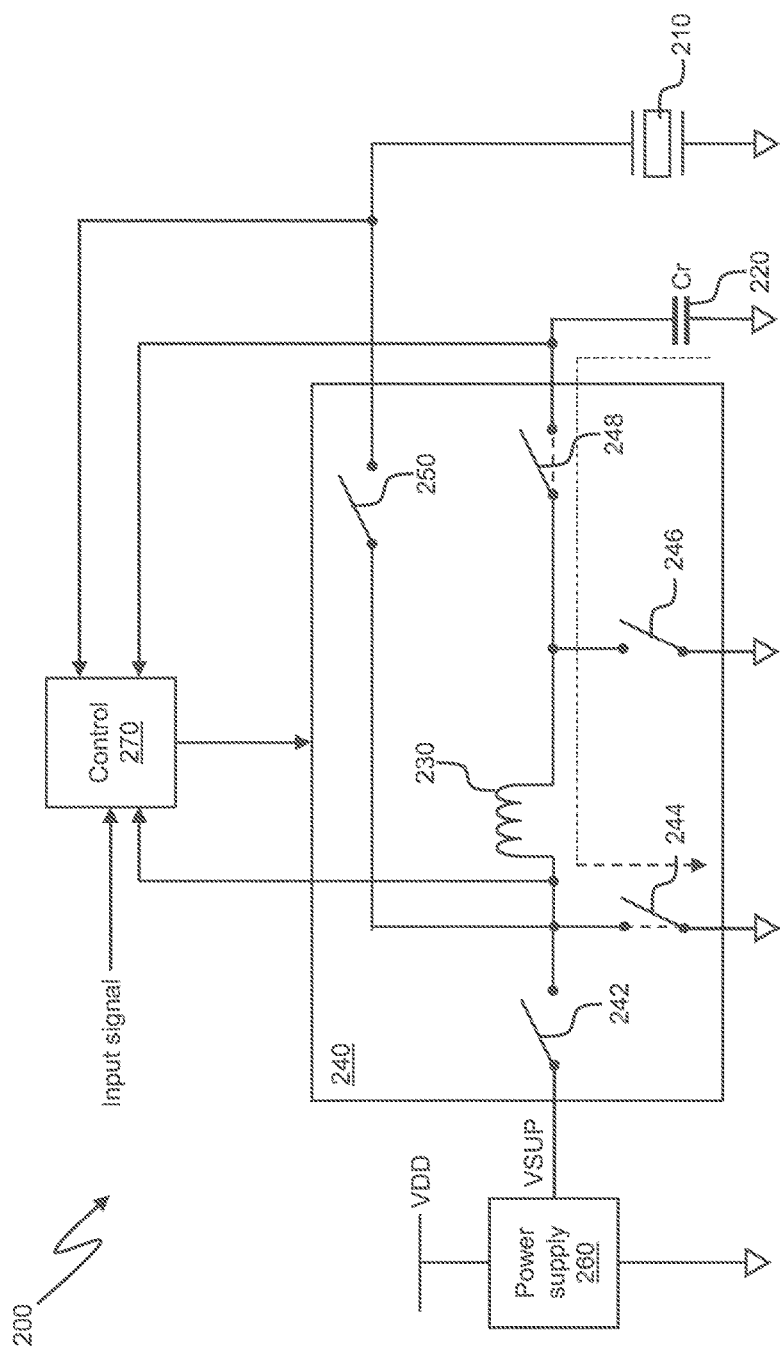

In a first phase (illustrated in FIG. 2*d*) of the charge transfer process the second and fourth switches 244, 248 are closed, as indicated by the dashed lines in FIG. 2*d*, in response to appropriate control signals transmitted by the control circuitry 270. A current path is therefore established from the reservoir capacitance 220 through the inductor 230. As current flows through the inductor 230 a magnetic field develops around it, storing energy.

In a second phase of the charge transfer process (illustrated in FIG. 2*e*), the third and fifth switches 246, 250 are closed, as indicated by the dashed lines in FIG. 2*e*, and the second and fourth switches 244, 248 are opened, in response to appropriate control signals transmitted by the control circuitry 270. The magnetic field around the inductor 230 collapses, inducing a current which flows from the inductor 230 to the piezoelectric transducer 210, thereby increasing the charge on the piezoelectric transducer 210.

When the system 200 is required to reduce the level of charge on the piezoelectric transducer 210, charge can be transferred from the piezoelectric transducer 210 to the reservoir capacitance 220, such that the charge remains available for future use, rather than being lost. This improves the efficiency of the system 200.

The process of transferring charge from the piezoelectric transducer 210 to the reservoir capacitance 220 occurs in two phases.

Figure 2F:
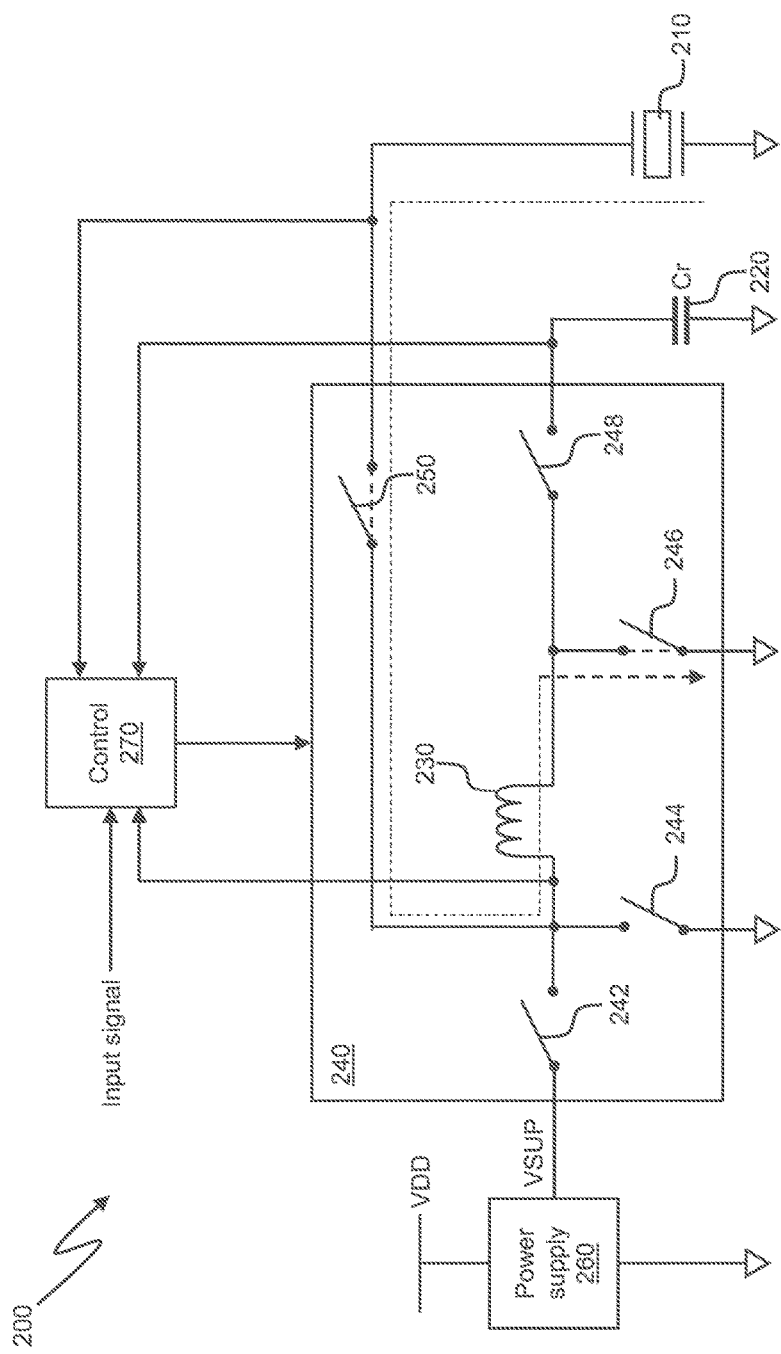

In a first phase (illustrated in FIG. 2*f*) the third and fifth switches 246, 250 are closed, as indicated by the dashed lines in FIG. 2*f*, in response to appropriate control signals transmitted by the control circuitry 270. A current path is therefore established from the piezoelectric transducer 210 through the inductor 230. As current flows through the inductor 230 a magnetic field develops around it, storing energy.

Figure 2G:
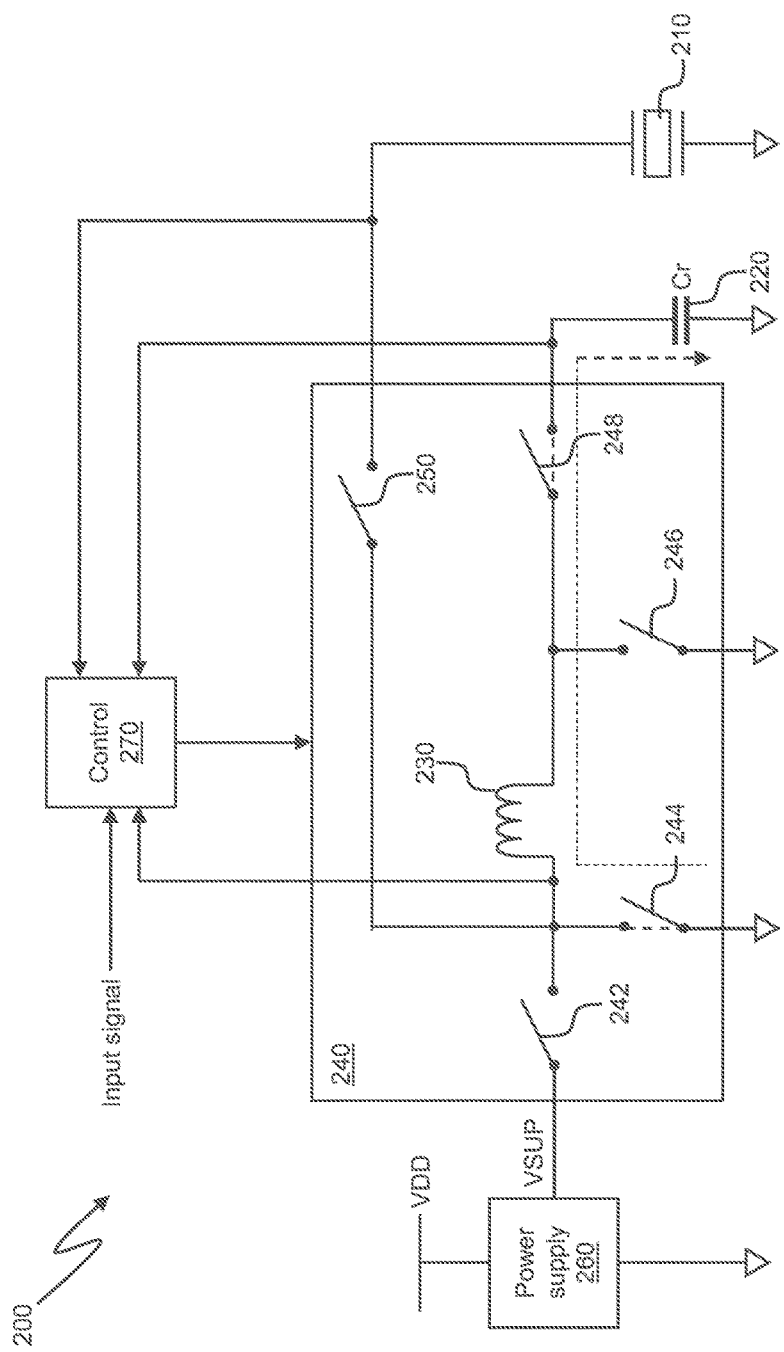

In a second phase (illustrated in FIG. 2*g*) the second and fourth switches 244, 248 are closed, as indicated by the dashed lines in FIG. 2*g*, and the third and fifth switches 246, 250 are opened, in response to appropriate control signals transmitted by the control circuitry 270. The magnetic field around the inductor 230 collapses, inducing a current which flows to the reservoir capacitance 220, thus charging the reservoir capacitance 220.

Thus in the system 200 the piezoelectric transducer 210 can be driven by transferring charge to it from the reservoir capacitance 220, and charge can be recycled between the piezoelectric transducer 210 and the reservoir capacitance 220 to improve power efficiency. The power supply 260 provides the initial charge to the reservoir capacitance 220 during the charging process and occasionally or periodically tops up or recharges the reservoir capacitance 220 as necessary.

Figure 3B:
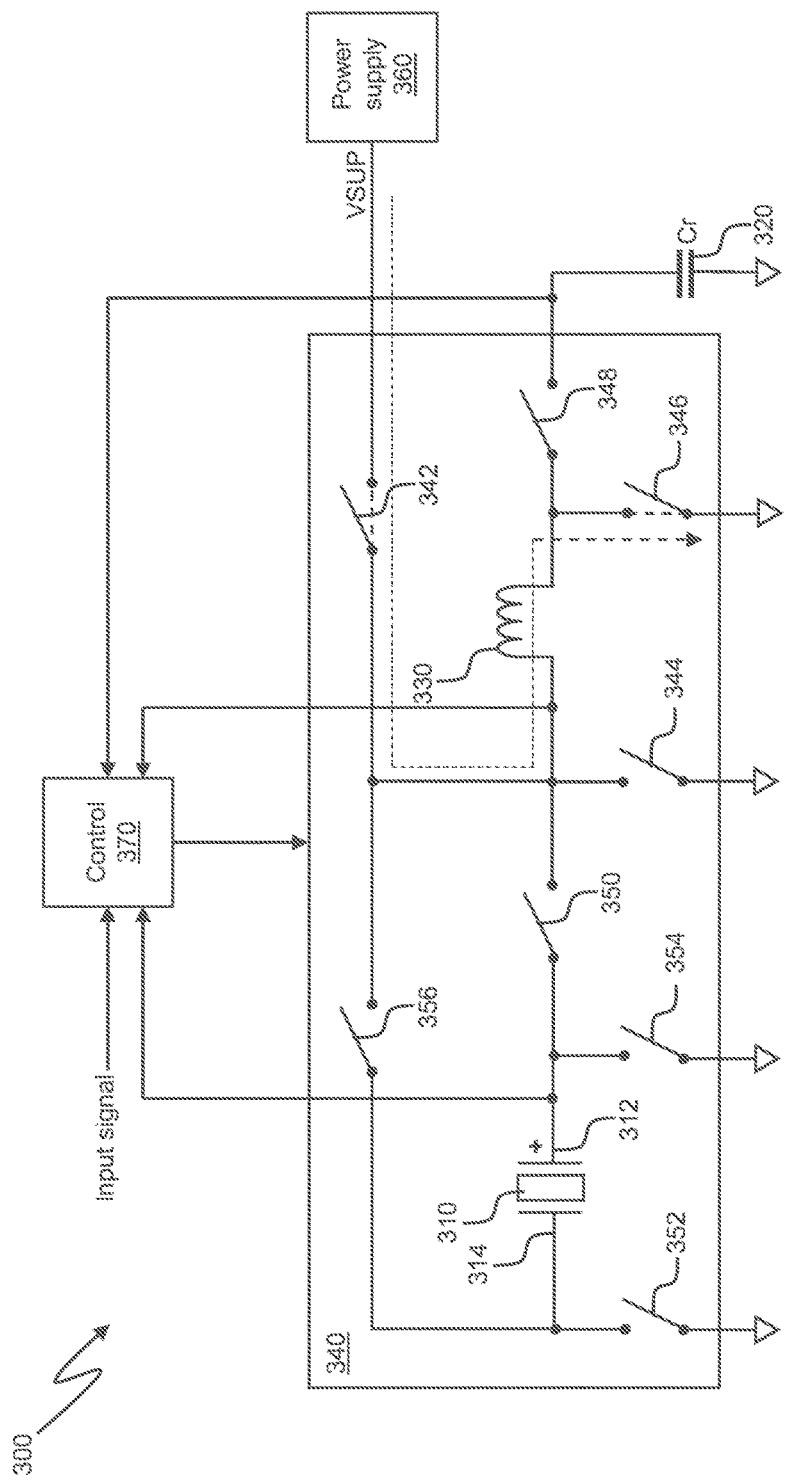
Figure 3C:
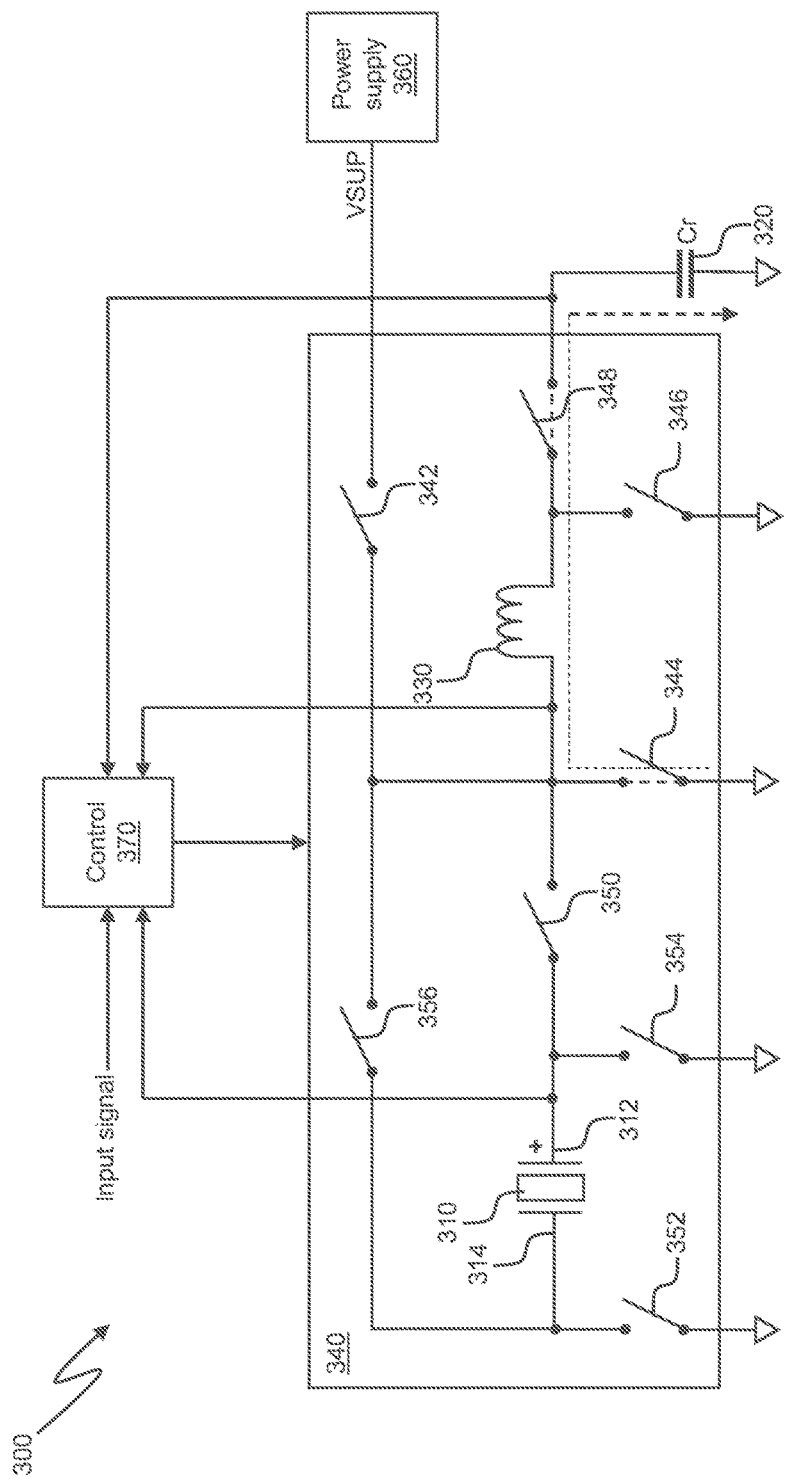

FIG. 2*a* shows the piezoelectric transducer in a single-ended configuration, with a first terminal coupled to the switch network 240 and a second terminal coupled to ground or some other reference voltage. FIG. 3*a* illustrates an alternative system in which a piezoelectric transducer is coupled in a bridge-tied load configuration.

The system, shown generally at 300 in FIG. 3, includes a piezoelectric transducer 310, reservoir capacitance 320 for storing charge, an inductor 330 and a switch network 340 (in this example comprising first to eighth controllable switches 342-356, which may be, for example, MOSFET devices) for transferring charge between the reservoir capacitance 320 and the piezoelectric transducer 310. Again, although the reservoir capacitance 320 is shown in FIG. 3*a* as a single capacitor, it will be appreciated that the reservoir capacitance 320 may alternatively be provided by a plurality of capacitors coupled together.

The system 300 also includes a power supply 360 for selectively providing charge to the reservoir capacitance 320. In some examples the power supply 360 may comprise a battery. In other examples the power supply 360 may comprise power supply circuitry that receives power from a power supply such as a battery.

The system 300 further includes control circuitry 370, operable to control the switching devices 342-356 to control the transfer of charge between the power supply 360, the reservoir capacitance 320 and the piezoelectric transducer 310, as will now be explained with reference to FIGS. 3*b*-3*h*.

On start-up of the system 300 (or a host device incorporating the system 300), charge is transferred from the power supply 360 to the reservoir capacitance 320 to raise a voltage across the reservoir capacitance 320 to a level that is suitable for driving the piezoelectric transducer 310.

In a first phase of a charging process (illustrated in FIG. 3*b*), the first and third switches 342, 346 are closed, as indicated by the dashed lines, in response to appropriate control signals transmitted by the control circuitry 370. This creates a current path (indicated by the dashed arrow) through the inductor 330. As current flows through the inductor 330 a magnetic field develops around it, storing energy.

In a second phase of the charging process (illustrated in FIG. 3c), the first and third switches 342, 346 are opened and the second and fourth switches 344, 348 are closed, as indicated by the dashed lines in FIG. 3c, again in response to appropriate control signals transmitted by the control circuitry 370. The magnetic field around the inductor 330 collapses, inducing a current which flows from the inductor 330 to the reservoir capacitance 320, thereby charging the reservoir capacitance 320.

The first and second phases are repeated until the voltage across the reservoir capacitance 320 has increased to a level that is suitable for driving the piezoelectric transducer 310, as determined by the control circuitry 370 based on a feedback signal received from the piezoelectric transducer 310. Once the reservoir capacitance 320 has been charged up to the desired level the first switch 342 is opened, thus decoupling the power supply 360, such that the piezoelectric transducer 310 can be driven by transferring charge from the reservoir capacitance 320.

When the system 300 is required to increase the level of charge on the piezoelectric transducer 310 by supplying charge to a first terminal 312 of the piezoelectric transducer 310, e.g. to drive the piezoelectric transducer 310 to produce a transducer output, the system 300 again operates in two phases.

Figure 3D:
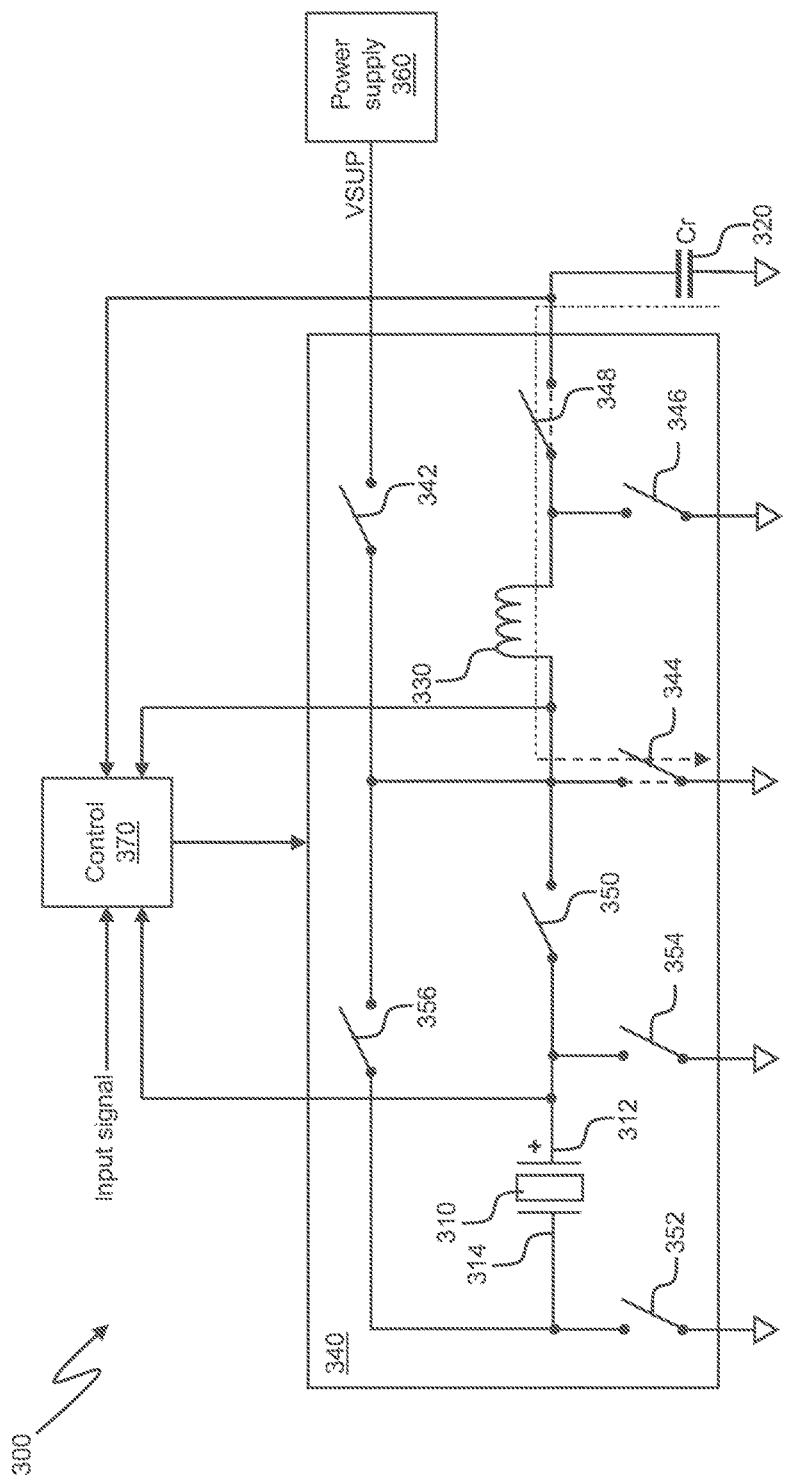

In a first phase (illustrated in FIG. 3d) of the charge transfer process the second and fourth switches 344, 348 are closed, as indicated by the dashed lines in FIG. 3d, in response to appropriate control signals transmitted by the control circuitry 370. A current path is therefore established from the reservoir capacitance 320 through the inductor 330. As current flows through the inductor 330 a magnetic field develops around it, storing energy.

Figure 3E:
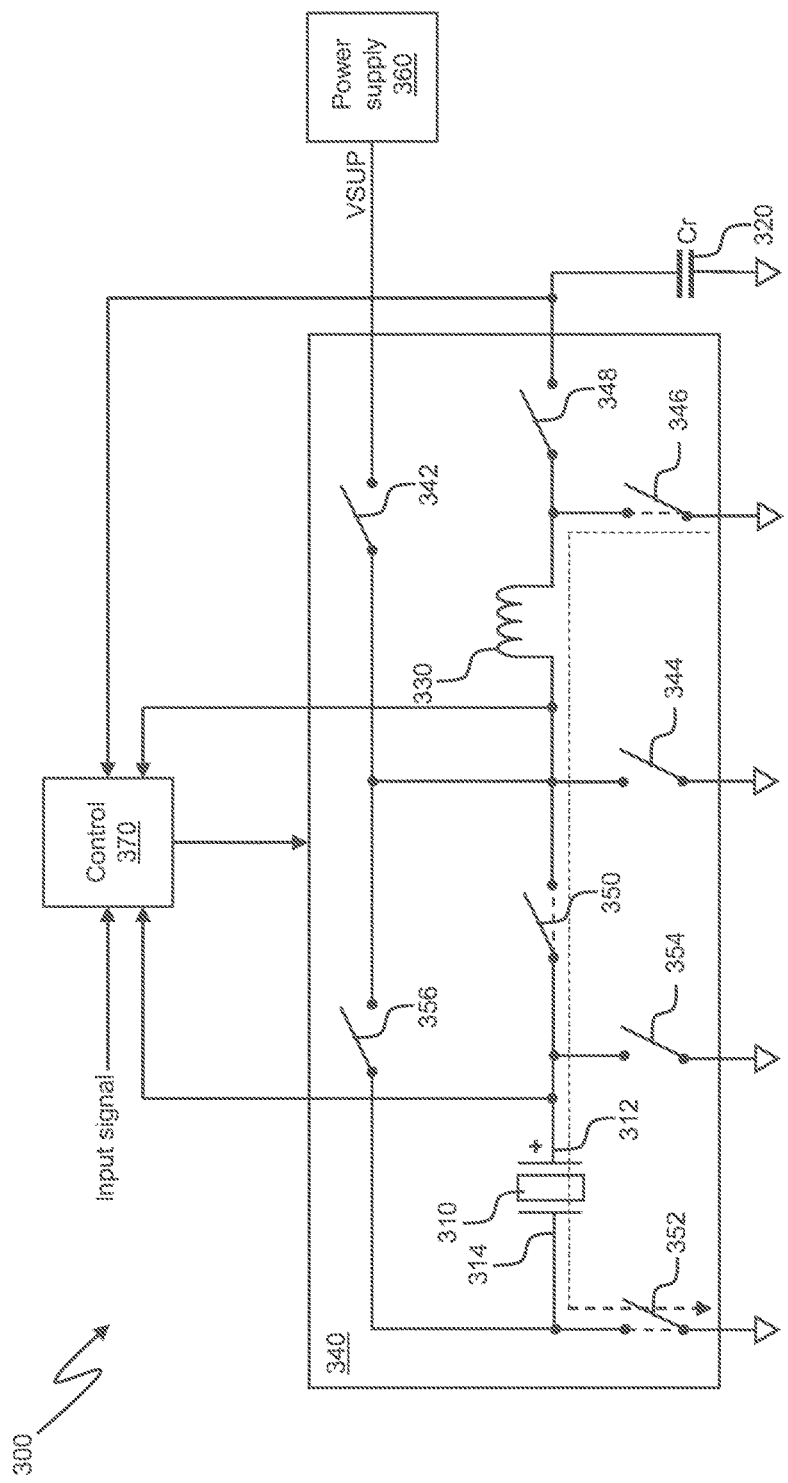

In a second phase of the charge transfer process (illustrated in FIG. 3e), the third, fifth and sixth switches 346, 350, 352 are closed, as indicated by the dashed lines in FIG. 3e, and the second and fourth switches 344, 348 are opened, in response to appropriate control signals transmitted by the control circuitry 370. The magnetic field around the inductor 330 collapses, inducing a current which flows from the inductor 330 to the first terminal 312 of the piezoelectric transducer 310, thereby increasing the charge on the piezoelectric transducer 310.

When the system 300 is required to increase the level of charge on the piezoelectric transducer 310 by supplying charge to a second terminal 314 of the piezoelectric transducer 310, e.g. to drive the piezoelectric transducer 310 to produce a transducer output, the system 300 again operates in two phases.

The first phase is as described above with reference to FIG. 3d.

Figure 3F:
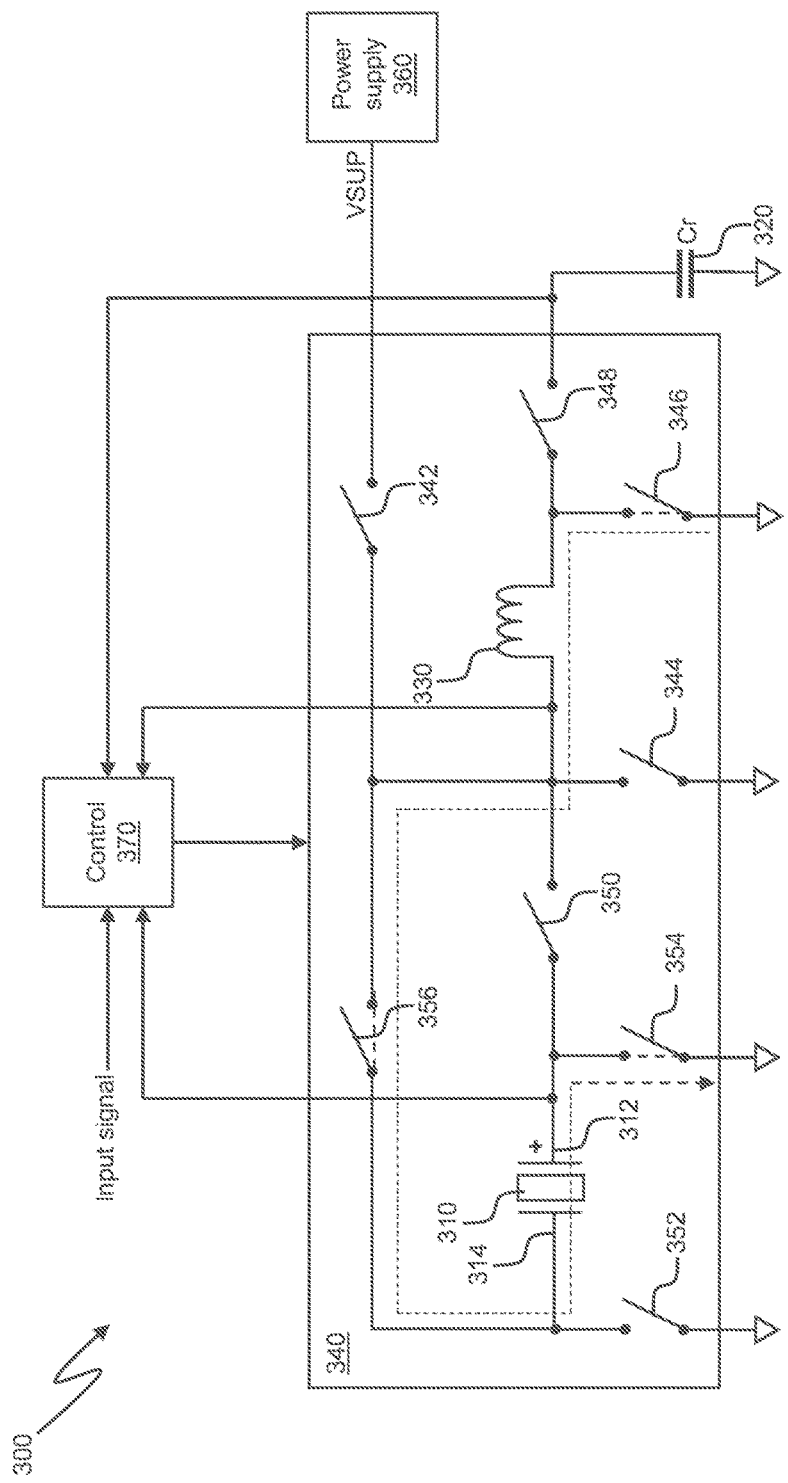
Figure 3G:
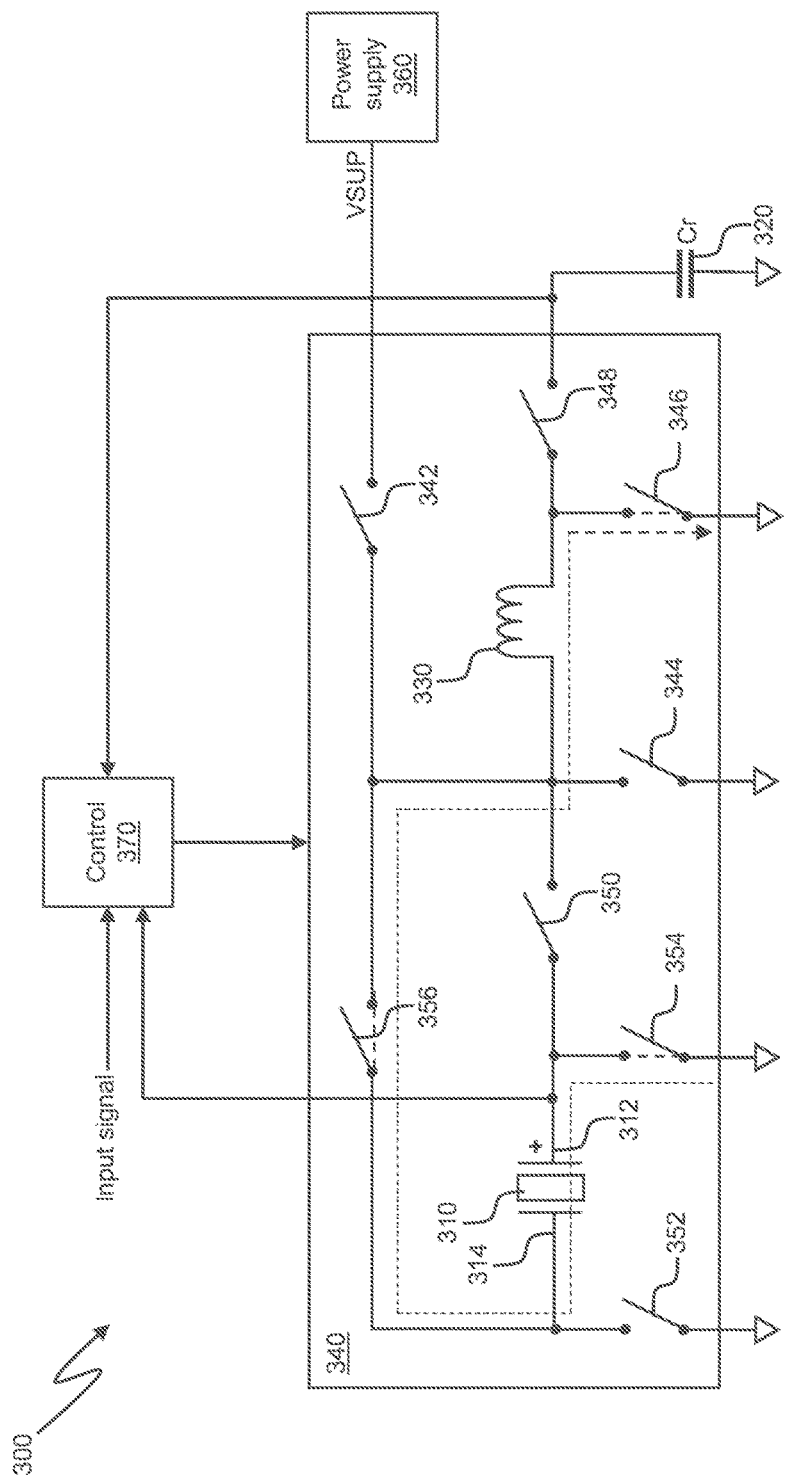

In a second phase of the charge transfer process (illustrated in FIG. 3f), the third, seventh and eighth switches 346, 354, 356 are closed, as indicated by the dashed lines in FIG. 3f, and the second and fourth switches 344, 348 are opened, in response to appropriate control signals transmitted by the control circuitry 370. The magnetic field around the inductor 330 collapses, inducing a current which flows from the inductor 330 to the second terminal 314 of the piezoelectric transducer 310, thereby increasing the charge on the piezoelectric transducer 310.

The process of transferring charge from the piezoelectric transducer 310 to the reservoir capacitance 320 occurs in two phases.

In a first phase (illustrated in FIG. 3g) the third, seventh and eighth switches 346, 354, 356 are closed, as indicated by the dashed lines in FIG. 2g, in response to appropriate control signals transmitted by the control circuitry 270. A current path is therefore established from the piezoelectric transducer 310 through the inductor 330. As current flows through the inductor 330 a magnetic field develops around it, storing energy.

Figure 3H:
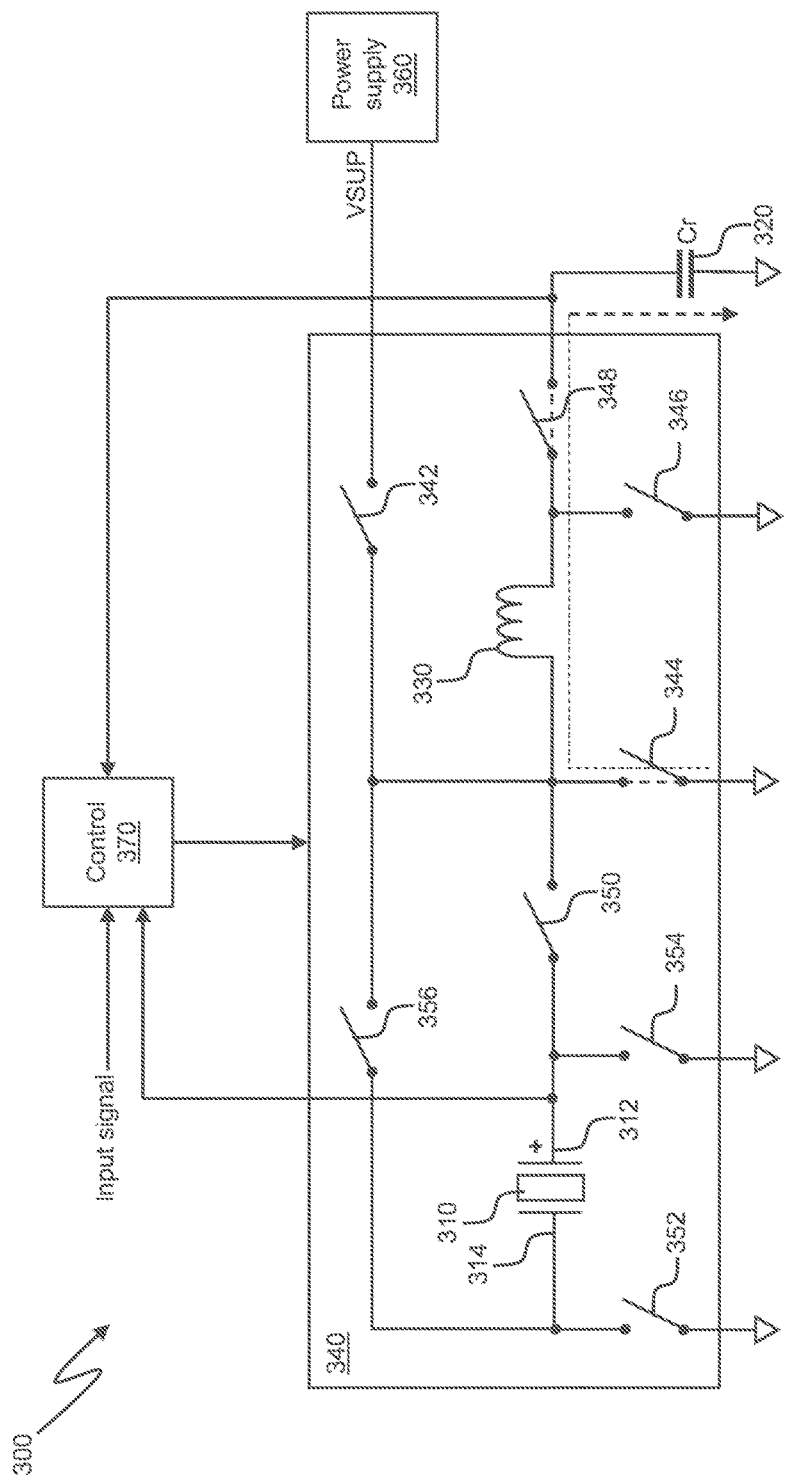

In a second phase (illustrated in FIG. 3h) the second and fourth switches 344, 348 are closed, as indicated by the dashed lines in FIG. 3h, and the third, seventh and eighth switches 346, 354, 356 are opened, in response to appropriate control signals transmitted by the control circuitry 370. The magnetic field around the inductor 330 collapses, inducing a current which flows to the reservoir capacitance 320, thus charging the reservoir capacitance 320.

Thus in the system 300 either terminal of the piezoelectric transducer 310 can be driven by transferring charge to it from the reservoir capacitance 320, and charge can be recycled between the piezoelectric transducer 310 and the reservoir capacitance 320 to improve power efficiency. The power supply 360 provides the initial charge to the reservoir capacitance 320 during the charging process and occasionally or periodically tops up or recharges the reservoir capacitance 320 as necessary.

In each of the systems described above, in order to determine the correct timing for transfer of charge between the reservoir capacitance and the piezoelectric transducer and from the power supply to the reservoir capacitance, the voltage across the reservoir capacitance and the charge stored on the piezoelectric transducer are monitored.

Referring back to FIG. 2a, the control circuitry 270 receives feedback signals indicative of a voltage VRES across the reservoir capacitance 220, a voltage VPIEZO across the piezoelectric transducer 210 and a current IL through the inductor 230.

Similarly, in the system 300 of FIG. 3a, the control circuitry 370 receives feedback signals indicative of a voltage VRES across the reservoir capacitance 320, a voltage VPIEZO across the piezoelectric transducer 310 and a current IL through the inductor 330.

The voltage across a piezoelectric transducer is not an accurate indication of the charge stored by the piezoelectric transducer at high input signal frequencies, since a piezoelectric transducer is not purely capacitive, but also includes a resistive component. However at lower input signal frequencies (e.g. 100 Hz or less) the voltage across the piezoelectric transducer is an acceptably accurate indication of the charge stored by the piezoelectric transducer. At higher frequencies the integral of the current IL through the inductor 230, 330 is a more accurate indication of the charge stored by the piezoelectric transducer.

Thus, at low input signal frequencies (e.g. when the input signal frequency is within a first range or below a threshold) the control circuitry 270, 370 may use the voltage across the piezoelectric transducer 210, 310, either directly as an indication of the charge stored on the piezoelectric transducer 210, 310, or to estimate the charge stored on the piezoelectric transducer 210, 310, in order to determine whether charge should be transferred to the piezoelectric transducer 210, 310 from the reservoir capacitance 220, 320 in response to the input signal received by the control circuitry 270, 370. At higher input signal frequencies (e.g. when the input signal frequency is within a second range or above the threshold) the control circuitry 270, 370 may use the current IL through the inductor 230, 330 (or the integral of the current IL through the inductor 230, 330), either directly as an indication of the charge stored on the piezoelectric transducer 210, 310, or to estimate the charge stored on the piezoelectric transducer 210, 310, in order to determine whether charge should be transferred to the piezoelectric transducer 210, 310 from the reservoir capacitance 220, 320 in response to the received input signal.

In the system 200 the control circuitry 270 monitors the charge stored on the piezoelectric transducer 210 (as indicated by the voltage VPIEZO, for low input signal frequencies, and as indicated by the current IL, for higher input signal frequencies) and controls the switch network 240 to transfer charge as required between the reservoir capacitance 220 and the piezoelectric transducer 210.

Thus if the magnitude of the input signal is increasing, such that charge must be transferred to the piezoelectric transducer 210 to produce a suitable output, the switch network 240 can be controlled by the control circuitry 270 to transfer charge from the reservoir capacitance 220 to the piezoelectric transducer 210. If the magnitude of the input signal is decreasing, such that charge must be transferred from the piezoelectric transducer 210 to produce a suitable output, the switch network 240 can be controlled by the control circuitry 270 to transfer charge from the piezoelectric transducer 210 to the reservoir capacitance 220.

The control circuitry 270 also monitors the charge stored on the reservoir capacitance 220 (as indicated by the voltage VRES across the reservoir capacitance) and controls the switch network 240 to transfer charge from the power supply 260 and the reservoir capacitance 220 as required to maintain a level of charge on the reservoir capacitance 220 required to supply the necessary charge to the piezoelectric transducer 210. For example, the control circuitry 270 may periodically compare the level of charge on the reservoir capacitance 220 to a threshold, and may control the switch network 240 to transfer charge from the power supply 270 to the reservoir capacitance 220 if the level of charge on the reservoir capacitance falls below the threshold, so as to top up or recharge the reservoir capacitance 220 to compensate for losses, e.g. resistive losses in the switch network 240 or the like, that cause the level of charge on the reservoir capacitance 220 to fall over time. Such transfer of charge from the power supply 270 to the reservoir capacitance 220 occurs while the switch network 240 is not being used to transfer charge between the reservoir capacitance 220 and the piezoelectric transducer 210.

The control circuitry 370 of the system 300 operates in a similar manner to control the switch network 340 to transfer charge between the reservoir capacitance 320 and the piezoelectric transducer 310 and to transfer charge from the power supply 360 to the reservoir capacitance 320 as necessary.

In some examples the additional circuitry may be provided to monitor a level of the input signal (e.g. an amplitude or envelope of the input signal) and cause the switch network to transfer charge from the power supply to the reservoir capacitance based on an expected level of the input signal, to ensure that sufficient charge is available on the reservoir capacitance to drive the piezoelectric transducer to produce an output based on the input signal.

Figure 4:
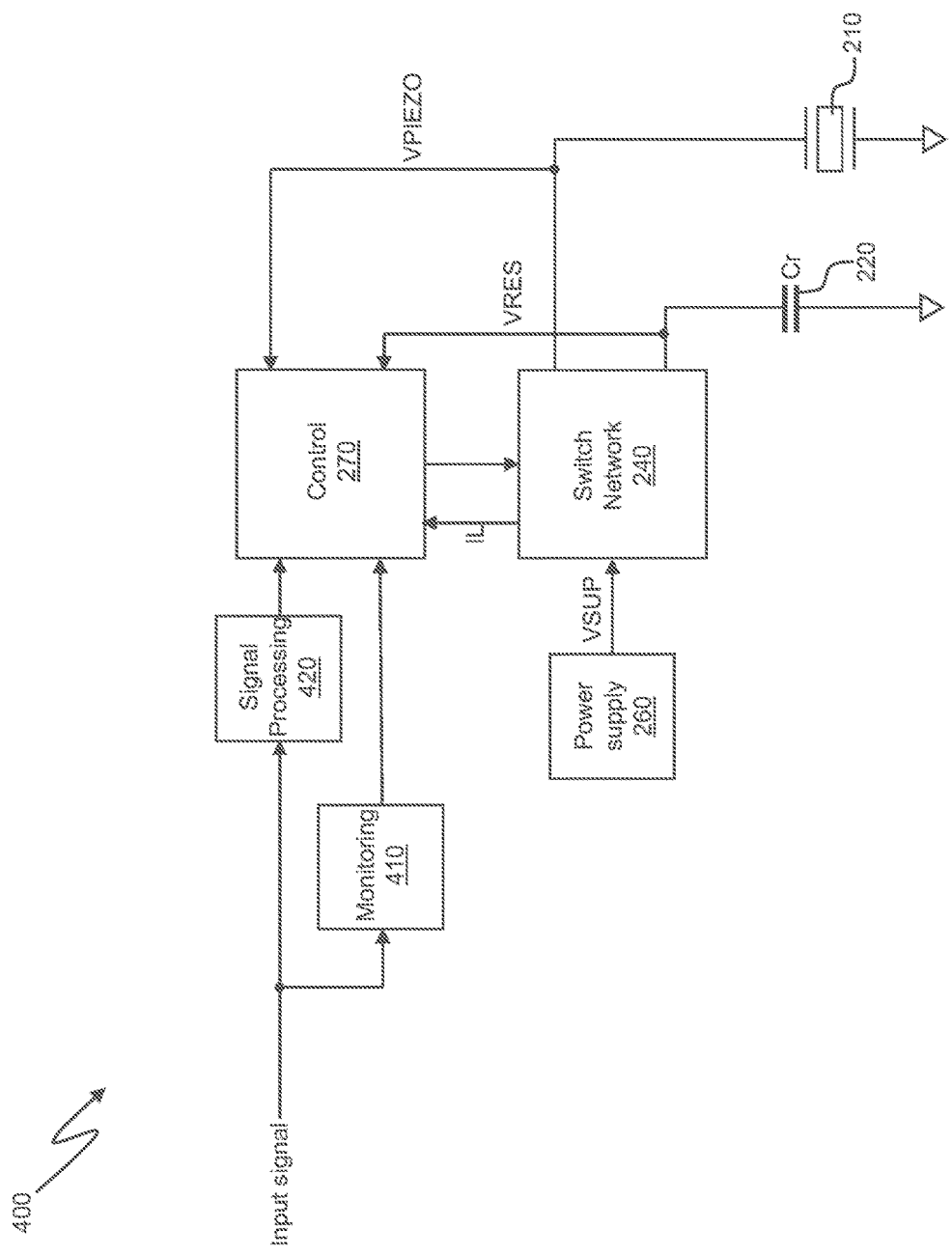
FIG. 4 is a schematic diagram illustrating further circuitry for transferring charge between a power supply, a reservoir capacitance and a piezoelectric transducer.

FIG. 4 is a schematic diagram illustrating a system including such additional circuitry. The system, shown generally at 400 in FIG. 4, is based on the system 200 described above with reference to FIG. 2a, and thus those elements that are common to the system 200 are denoted by common reference numerals, and will not be described in detail here.

It will of course be understood by those of ordinary skill in the art that the principles described here are equally applicable to the system 300 of FIG. 3a.

The system 400 differs from the system 200 in that it includes additional circuitry 410 for monitoring a level of the input signal that is received by the control circuitry 270. The additional circuitry may comprise, for example, circuitry for monitoring a level or magnitude (e.g. a voltage or current level or magnitude) of the input signal, look-ahead circuitry or envelope detector circuitry. The additional circuitry 410 receives the input signal and outputs a signal to the control circuitry 270 indicative of the level (e.g. amplitude or envelope) of the input signal. The control circuitry 270 controls the switch network 240, based on the signal received from the additional circuitry 410, to transfer charge from the power supply 260 to the reservoir capacitor 260 if necessary, to ensure that sufficient charge is available on the reservoir capacitor 260 to accommodate an expected level of the input signal, i.e. to drive the piezoelectric transducer 210 to produce an output based on the input signal.

The system 400 may further include signal processing circuitry 420 configured to process the input signal. The signal processing circuitry 420 may include upsampling circuitry to convert the input signal, which may be at an audio sampling rate such as 48 kHz, to a higher rate (e.g. 12.28 MHz, which is equal to 256 times the sample rate of the input signal) that corresponds to an operating frequency of the switch network 240 and/or the control circuitry 270. The signal processing circuitry 420 may further include interpolation circuitry for interpolating an upsampled version of the input signal.

As will be appreciated by those skilled in the art, such signal processing circuitry introduces a delay to the input signal, such that the control circuitry 270 receives a delayed version of the input signal in addition to the signal output by the additional circuitry 410. The signal processing circuitry 420 may, additionally or alternatively, comprise dedicated delay circuitry to introduce a delay or an additional delay to the input signal. This delay is beneficial as it allows time for the additional circuitry 410 to output the signal used by the control circuitry 270 to control the transfer of charge from the power supply 260 to the reservoir capacitance 220, if necessary, to ensure sufficient charge is available on the reservoir capacitance 220 to accommodate the level of the input signal in advance of the delayed input signal being received by the control circuitry 270.

Thus the additional circuitry 410 provides look-ahead circuitry configured to output a control signal to the control circuitry 270 based on the input signal, to cause the control circuitry 270 to control the switch network 240 to transfer charge from the power supply 260 to the reservoir capacitance 220, if necessary, to accommodate the input signal.

The systems 200, 300 described above use an inductor as an intermediate energy storage device in a two-stage charge transfer process for transferring charge from the power supply to the reservoir capacitance and in a two-stage charge transfer process for transferring charge between the reservoir capacitance and the piezoelectric transducer.

In another example, charge may be transferred from the power supply to the reservoir capacitance and between the reservoir capacitance and the piezoelectric transducer directly, i.e. without any intermediate energy storage device, as will now be described with reference to FIG. 5, which schematically illustrates a system 500 for direct charge transfer for driving a piezoelectric transducer 510.

The system 500 includes a reservoir capacitance 520 for storing charge (which, as in the systems 200, 300 described above, may be provided as a single capacitor or as multiple capacitors coupled together) and a switch network 540 (in this example comprising first to third controllable switches 542-546, which may be, for example, MOSFET devices) for transferring charge between the reservoir capacitance 520 and the piezoelectric transducer 510.

The system, shown generally at 500 in FIG. 5, includes a piezoelectric transducer 510, a reservoir capacitance 520, switch network circuitry 540, a power supply 560 and control circuitry 570.

The system 500 also includes a power supply 560 for selectively providing charge to the reservoir capacitance 520. In some examples the power supply 560 may comprise power supply circuitry that receives power from a power source such as a battery that is external to the system 500. The power supply 560 may be configured to generate an output voltage VSUP for charging the reservoir capacitance 520 based on a lower voltage supplied to the power supply 560 from the external power source. Thus the output voltage VSUP provided by the power supply 560 is greater than the supply voltage received by the power supply 560 from the external power source, and so the power supply 560 may be referred to as a boosted power supply.

The first switching device 542 is coupled between an output of the power supply 560 and a first terminal 522 of the reservoir capacitance 520. A second terminal 524 of the reservoir capacitance is coupled to a ground/reference voltage supply rail.

The second switching device 544 is coupled between the first terminal 512 of the reservoir capacitance 520 and the ground/reference voltage supply rail.

The third switching device 546 is coupled between the first terminal of the reservoir capacitance 520 and a first terminal 512 of the piezoelectric transducer. A second terminal 514 of the piezoelectric transducer 510 is coupled to the ground/reference voltage supply rail.

The system 500 further includes control circuitry 570, operable to control the switching devices 542-546 to control the transfer of charge between the power supply 560, the reservoir capacitance 520 and the piezoelectric transducer 510 in order to produce an output at the piezoelectric transducer 510 based on an input signal that is received by the control circuitry 570. The control circuitry 570 is coupled to the first terminal 512 of the piezoelectric transducer 510 so as to receive a feedback signal indicative of a voltage VPIEZO across the piezoelectric transducer 510.

The power supply 560 may be a tracking power supply which outputs a voltage VSUP that varies based on a level (e.g. an amplitude or an envelope) of the input signal or based on a control signal output by the control circuitry 570 to the power supply 560.

In use of the system 500 the power supply 560 outputs a voltage VSUP that is the same as or slightly higher than the voltage required to produce a desired output at the piezoelectric transducer 510 based on the input signal.

In order to produce a desired output (based on the input signal) at the piezoelectric transducer 510 a first charge transfer operation is performed, in which the control circuitry 570 outputs appropriate control signals to the switch network 540 to cause the first switch 542 to close for a predetermined period of time, while the second and third switches 544, 546 remain open. Thus, charge is transferred from the power supply 560 to the reservoir capacitance 520. A second charge transfer operation is then performed, in which the control circuitry 570 outputs appropriate control signals to the switch network 540 to cause the third switch 546 to close for a predetermined period of time, while the first and second switches 542, 544 remain open. Thus, charge is transferred from the reservoir capacitance 520 to the piezoelectric transducer 510.

This first and second charge transfer operations are repeated as required until the voltage VPIEZO across the piezoelectric transducer 510 (as determined by the control circuitry 570 based on the feedback signal) reaches the required level, at which point the control circuitry 570 transmits control signals to cause the first, second and third switches 542-546 to open.

Transferring charge to the piezoelectric transducer 510 via the reservoir capacitance 520 in this manner has the effect of filtering out any ringing or overshoot in the voltage VSUP output by the power supply 560. Thus the switch network 540 and reservoir capacitance 520 effectively act as a low pass filter.

Charge can be transferred from the piezoelectric transducer 510 to the reservoir capacitance 520 by transmitting appropriate control signals from the control circuitry 570 to close the third switch 546 and open the first and second switches 542, 544.

When it is necessary to discharge the reservoir capacitance 520 (e.g. on shut-down of the system, to reduce the risk of potentially harmful accidental discharge events) the control circuitry 570 transmits control signals to the switch network 540 to open the first and third switches 542, 546 and to close the second switch 544, thereby allowing the reservoir capacitance to discharge to the ground/reference voltage supply rail. Similarly, when it is necessary to discharge the piezoelectric transducer 510 (e.g. on shut-down of the system, to reduce the risk of potentially harmful accidental discharge events) the control circuitry 570 transmits control signals to the switch network 540 to open the first switch 542 and to close the second and third switches 544, 546, thereby allowing the piezoelectric transducer 510 to discharge to the ground/reference voltage supply rail.

If the reservoir capacitance 520 is small, the first and second charge transfer operations will need to be repeated a relatively large number of times in order for the voltage VPIEZO across the piezoelectric transducer 510 to reach the required level, which in turn requires that the control circuitry 570 and the switch network 540 are able to operate at high speed to accommodate high input signal frequencies. However, using a small reservoir capacitance 520 allows accurate control of the voltage across the piezoelectric transducer 510.

In contrast, a larger reservoir capacitance 520 requires fewer repetitions of the first and second charge transfer operations and permits the use of a lower speed switch network 540 and control circuitry 570, at the cost of reduced accuracy in the control of the voltage across the piezoelectric transducer 510.

In some examples the reservoir capacitance 520 may be variable, in response to a control signal transmitted by the control circuitry 570 (indicated by the dashed arrow in FIG. 5) to allow greater flexibility in balancing the requirements of accurate control of the voltage VPIEZO and the operating speed of the control circuitry 570 and the switch network 540.

The examples described above with reference to FIGS. 2a, 4 and 5 all drive a piezoelectric transducer as a single-ended load, i.e. a first terminal of the piezoelectric transducer is coupled to an output of the switch network and a second terminal of the piezoelectric transducer is coupled to the ground/reference voltage supply rail.

It may be advantageous to be able to make the drive bipolar, i.e. drive either of the terminals of the piezoelectric transducer. This can be achieved by using commutator circuitry coupled to the piezoelectric transducer, as will now be described with reference to FIG. 6, which shows a system 600 for driving a piezoelectric transducer 610.

The system 600 includes a reservoir capacitance 620, a switch network 650, power supply circuitry 660 and control circuitry 670 which may be similar to the corresponding elements of the system 200 of FIG. 2a, or may be similar to the corresponding elements of the system 500 of FIG. 5. Thus the structure and operation of the switch network 650, power supply circuitry 660 and control circuitry 670 will not be described here in detail.

The system 600 further includes commutator circuitry 680, which in the illustrated example includes first to fourth controllable switches 682-688. The commutator circuitry 680 is coupled to the control circuitry 670 so as to receive control signals for controlling the operation of the controllable switches 682-688 according to the input signal.

The first controllable switch 682 is coupled between a first node 690 of the commutator circuitry 680 and a first terminal 612 of the piezoelectric transducer 610. The first node 690 of the commutator circuitry 680 is coupled to an output of the switch network 640, which is operative to transfer charge between the reservoir capacitance 620 and the piezoelectric transducer 610, either via an intermediate inductor (as in the system 200 of FIG. 2a, described above), or directly (i.e. without any intermediate inductor, as in the system 500 of FIG. 5, described above).

The second controllable switch 684 is coupled between the first terminal 612 of the piezoelectric transducer 610 and the ground/reference voltage supply rail.

The third controllable switch 686 is coupled between the first node 690 of the commutator circuitry 680 and a second terminal 614 of the piezoelectric transducer 610.

The fourth controllable switch 688 is coupled between the second terminal 614 of the piezoelectric transducer 610 and the ground/reference voltage supply rail.

By selectively opening and closing the controllable switches 682-688 one of the first and second terminals 612, 614 of the piezoelectric transducer 610 can be coupled to the output of the switch network 640, and the other of the first and second terminals 612, 614 of the piezoelectric transducer 610 can be coupled to the ground/reference voltage supply rail.

The operation of the controllable switches 682-688 is controlled by the control circuitry 670 according to the polarity (with respect to ground or the reference voltage supplied by the ground/reference voltage supply rail) of the input signal, as shown in the table below.

| Input signal polarity | First switch 682 | Second switch 684 | Third switch 686 | Fourth switch 688 |
|---|---|---|---|---|
| Positive | Closed | Open | Open | Closed |
| Negative | Open | Closed | Closed | Open |

Thus, when the input signal is positive, the fourth switch 688 is closed, thereby coupling the second terminal 614 of the piezoelectric transducer 610 to the reference voltage supply rail. The second and third switches 684, 686 are open. When charge is to be transferred to the first terminal 612 of the piezoelectric transducer 610, the first switch 682 is closed, thus coupling the first terminal 612 of the piezoelectric transducer 610 to the output of the switch network 640.

When the input signal is negative, the second switch 884 is closed, thereby coupling the first terminal 612 of the piezoelectric transducer 610 to the ground/reference voltage supply rail. The first and fourth switches 682, 688 are open. When charge is to be transferred to the second terminal 614 of the piezoelectric transducer 610, the third switch 686 is closed, thus coupling the second terminal 614 of the piezoelectric transducer 610 to the output of the switch network 640.

Thus either the first terminal 612 or the second terminal 614 of the piezoelectric transducer 610 can be driven by the charge transferred by the switch network 640, depending on the polarity of the input signal.

As will be apparent from the foregoing discussion, the circuitry of the present disclosure provides a power efficient means for driving a piezoelectric transducer using charge, which reduces the hysteresis and creep that can arise when such a piezoelectric transducer is voltage-driven. Improved power efficiency arises due to the recycling of charge between the reservoir capacitance and the piezoelectric transducer, and the use of the reservoir capacitor helps to reduce the effects of ringing or overshoot in a voltage output by a power supply that is used to charge the reservoir capacitance.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single

The invention claimed is:

1. Circuitry for driving a piezoelectric transducer based on an input signal, the circuitry being configured to receive a supply of power from a power supply, the circuitry comprising:
 a reservoir capacitance;
 switch network circuitry;
 monitoring circuitry configured to monitor a level or magnitude of the input signal and to output a signal indicative of the level or magnitude of the input signal; and
 control circuitry configured to control operation of the switch network circuitry so as to charge the reservoir capacitance from the power supply and to transfer charge between the reservoir capacitance and the piezoelectric transducer;
 wherein the control circuitry is further configured to control operation of the switch network circuitry to transfer charge from the power supply to the reservoir capacitance based on the signal indicative of the level of the input signal.

2. Circuitry according to claim 1 wherein a capacitance value of the reservoir capacitance is variable.

3. Circuitry according to claim 1 wherein the circuitry further comprises look-ahead circuitry configured to receive the input signal and to output a signal indicative of the level of the input signal to the control circuitry.

4. Circuitry according to claim 1 wherein the circuitry further comprises envelope detector circuitry configured to receive the input signal and to output a signal indicative of an envelope of the input signal to the control circuitry.

5. Circuitry according to claim 1 wherein the switch network circuitry is configured for coupling to a single terminal of the piezoelectric transducer.

6. Circuitry according to claim 1 wherein the switch network circuitry is configured to be coupled to first and second terminals of the piezoelectric transducer.

7. Circuitry according to claim 1 wherein the power supply is configured to provide an output voltage that varies according to a level of the input signal.

8. Circuitry according to claim 1 wherein the power supply is configured to provide an output voltage that is greater than a voltage supplied to the power supply by a power source.

9. Circuitry according to claim 1 wherein the power supply comprises a switching power supply.

10. Circuitry according to claim 1 wherein the control circuitry is configured to receive a feedback signal indicative of a level of charge of the piezoelectric transducer.

11. Circuitry according to claim 10 wherein the feedback signal is based on a voltage across the piezoelectric transducer.

12. Circuitry according to claim 10, wherein the circuitry comprises one or more inductors, wherein the control circuitry is configured to control operation of the switch network circuitry to transfer charge between the reservoir capacitance and the piezoelectric transducer via one of the one or more inductors, and wherein the feedback signal is based on a current through the one of the one or more inductors.

13. Circuitry according to claim 1 wherein the input signal comprises an audio signal, a haptic waveform or an ultrasonic signal.

14. Circuitry according to claim 1 further comprising commutator circuitry coupled to the switch network circuitry, the commutator circuitry being configured to selectively couple a first or a second terminal of the piezoelectric transducer to an output of the switch network circuitry.

15. A device comprising the circuitry of claim 1.

16. Circuitry according to claim 1 further comprising one or more inductors, wherein the control circuitry is configured to control operation of the switch network circuitry to transfer charge between the reservoir capacitance and the piezoelectric transducer via one of the one or more inductors.

17. Circuitry according to claim 16 wherein the control circuitry is configured to control operation of the switch network circuitry to transfer charge from the power supply to the reservoir capacitance via one of the one or more inductors.

18. Circuitry according to claim 1 wherein the control circuitry is configured to control operation of the switch network circuitry so as to transfer charge directly between the reservoir capacitance and the piezoelectric transducer.

19. Integrated circuitry comprising the circuitry of claim 1.

20. A device according to claim 15, wherein the device comprises a mobile telephone, a tablet or laptop computer, a smart speaker, an accessory device, headphones, earphones or earbuds.

21. Circuitry for driving a piezoelectric transducer based on an input signal, the circuitry being configured to receive a supply of power from a power supply, the circuitry comprising:
 a reservoir capacitance;
 switch network circuitry;
 monitoring circuitry configured to monitor a level or magnitude of the input signal and to output a signal indicative of the level or magnitude of the input signal; and
 control circuitry configured to control operation of the switch network circuitry so as to charge the reservoir capacitance from the power supply based on the signal indicative of the input signal.

22. Circuitry for estimating a level of charge on a piezoelectric transducer, the circuitry comprising:
 an inductor for transferring charge to the piezoelectric transducer from a charge source;
 control circuitry configured to control transfer of charge to the piezoelectric transducer based on an input signal,
 wherein the control circuitry is configured to receive an indication of a current through the inductor and an indication of a voltage across the piezoelectric transducer,
 and wherein the control circuitry is configured to estimate the level of charge on the piezoelectric transducer based on:
  the indication of the voltage across the piezoelectric transducer when a frequency of the input signal is within a first range, and
  the indication of the current through the inductor when the frequency of the input signal is within a second range.

* * * * *